(12) United States Patent
Lee et al.

(10) Patent No.: US 11,651,738 B2
(45) Date of Patent: *May 16, 2023

(54) SCAN DRIVER AND DISPLAY DEVICE HAVING THE SAME

(71) Applicant: Samsung Display Co., Ltd., Yongin-si (KR)

(72) Inventors: Jae Hoon Lee, Yongin-si (KR); Kuk Hwan Ahn, Yongin-si (KR); Seok Ha Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/367,399

(22) Filed: Jul. 4, 2021

(65) Prior Publication Data

US 2021/0335270 A1 Oct. 28, 2021

Related U.S. Application Data

(63) Continuation of application No. 16/427,359, filed on May 31, 2019, now Pat. No. 11,056,058.

(30) Foreign Application Priority Data

Aug. 21, 2018 (KR) .................. 10-2018-0097610

(51) Int. Cl.
*G09G 3/3266* (2016.01)
*G09G 3/3275* (2016.01)
*G09G 3/3233* (2016.01)

(52) U.S. Cl.
CPC ......... *G09G 3/3266* (2013.01); *G09G 3/3233* (2013.01); *G09G 3/3275* (2013.01);
(Continued)

(58) Field of Classification Search
CPC .. G09G 3/3266; G09G 3/3275; G09G 3/3233; G09G 3/3225; G09G 3/3208;
(Continued)

(56) References Cited

U.S. PATENT DOCUMENTS 9,035,865 B2 5/2015 Pak et al.
9,729,146 B2 8/2017 Ahn et al.
(Continued)

FOREIGN PATENT DOCUMENTS

KR 10-2011-0102684 9/2011
KR 10-2015-0094951 8/2015
(Continued)

OTHER PUBLICATIONS

Non-Final Office Action dated Dec. 14, 2020, in U.S. Appl. No. 16/427,359.
(Continued)

*Primary Examiner* — Alexander Eisen
*Assistant Examiner* — Kebede T Teshome
(74) *Attorney, Agent, or Firm* — H.C. Park & Associates, PLC

(57) ABSTRACT

An nth (where n is a natural number) stage is included in a scan driver of a display. The nth stage includes: a first input circuit for controlling a voltage of a first node in response to a carry signal of a previous stage; a second input circuit for controlling the voltage of the first node in response to a carry signal of a next stage; a first control circuit for controlling a voltage of an output terminal in response to the carry signal of the next stage; an output circuit for outputting an nth scan signal and an nth carry signal in response to the voltage of the first node and a voltage of a second node; and a leakage control circuit for supplying a control voltage to the first input circuit and the second input circuit in response to one of the nth scan signal and the nth carry signal.

17 Claims, 14 Drawing Sheets

(52) U.S. Cl.
CPC . *G09G 2310/0248* (2013.01); *G09G 2310/08* (2013.01); *G09G 2330/08* (2013.01); *G09G 2330/10* (2013.01)

(58) Field of Classification Search
CPC ......... G09G 3/3677; G09G 2310/0248; G09G 2330/08; G09G 2330/10; G09G 2310/08; G09G 2310/0286; G09G 2320/029; G09G 2300/0426; G09G 2300/0861; G09G 2300/0842; G09G 2300/0819; G11C 19/28
See application file for complete search history.

(56) References Cited

U.S. PATENT DOCUMENTS

| | | | |
|---|---|---|---|
| 9,905,188 | B2 | 2/2018 | Park et al. |
| 2012/0092302 | A1 | 4/2012 | Imai et al. |
| 2016/0218707 | A1 | 7/2016 | Park et al. |
| 2017/0032733 | A1 | 2/2017 | Jang |
| 2017/0032756 | A1* | 2/2017 | Kim ................... G09G 3/3674 |
| 2017/0316731 | A1 | 11/2017 | Cho et al. |
| 2018/0018921 | A1 | 1/2018 | Park et al. |
| 2019/0164498 | A1* | 5/2019 | Jang ........................ G09G 3/32 |

FOREIGN PATENT DOCUMENTS

| | | |
|---|---|---|
| KR | 10-2016-0073928 | 6/2016 |
| KR | 10-2016-0079985 | 7/2016 |
| KR | 10-2017-0014836 | 2/2017 |
| KR | 10-2017-0124425 | 11/2017 |
| KR | 10-2018-0007719 | 1/2018 |

OTHER PUBLICATIONS

Notice of Allowance dated Mar. 8, 2021, in U.S. Appl. No. 16/427,359.
Office Action dated Sep. 19, 2022 from the Korean Patent Office for Korean Patent Application No. 10-2018-0097610.

* cited by examiner

SCAN DRIVER AND DISPLAY DEVICE HAVING THE SAME

CROSS-REFERENCE TO RELATED APPLICATION

The application is a Continuation of U.S. patent application Ser. No. 16/427,359, filed on May 31, 2019, which claims priority from and the benefit of Korean Patent Application No. 10-2018-0097610, filed on Aug. 21, 2018, each of which is hereby incorporated by reference for all purposes as if fully set forth herein.

BACKGROUND

Field

Exemplary embodiments/implementations of the invention relate generally to a display device and, more specifically, to a scan driver for stably outputting a scan signal and/or a sensing signal, and a display device having the scan driver.

Discussion of the Background

A liquid crystal display (LCD) using liquid crystals, an organic light emitting display (OLED), and the like are used as display devices.

Recently, oxide semiconductor transistors have come into the spotlight as thin film transistors for display panels because they have mobility higher than that of amorphous silicon transistors and are easily applied to a large areas through lower temperature processing than that of polysilicon transistors. However, since the oxide semiconductor transistors are sensitive to light, the oxide semiconductor transistors have a weak point that their element characteristics are varied. In addition, an oxide semiconductor layer is degraded by light exposure, and therefore, the threshold voltage of the oxide semiconductor transistors may be shifted.

Thus, a display device is required that can stably operate regardless of a change in a characteristic of such a transistor.

The above information disclosed in this Background section is only for understanding of the background of the inventive concepts, and, therefore, it may contain information that does not constitute prior art.

SUMMARY

Exemplary embodiments provide a scan driver including a leakage control circuit for ensuring reliability of a scan signal output.

Exemplary embodiments also provide a scan driver including a leakage control circuit for ensuring reliability of the scan signal and sensing signal.

Exemplary embodiments further provide a display device having the scan driver.

Additional features of the inventive concepts will be set forth in the description which follows, and in part will be apparent from the description, or may be learned by practice of the inventive concepts.

According to an exemplary embodiment, there is provided a scan driver including a plurality of stages each configured to output a scan signal, wherein an nth (n is a natural number) stage includes: a first input circuit configured to control a voltage of a first node in response to a carry signal of a previous stage, which is supplied to a first input terminal; a second input circuit configured to control the voltage of the first node in response to a carry signal of a next stage, which is supplied to a second input terminal; a first control circuit configured to control a voltage of a first output terminal that outputs an nth scan signal in response to the carry signal of the next stage; a first output circuit coupled to a scan clock input terminal, a carry clock input terminal, a first power input terminal to which a first power source is supplied, and a second power input terminal to which a second power source is supplied, the first output circuit outputting the nth scan signal corresponding to a scan clock signal supplied to the scan clock input terminal and an nth carry signal corresponding to a carry clock signal supplied to the carry clock input terminal respectively to the first output terminal and a carry output terminal in response to the voltage of the first node and a voltage of a second node; a second output circuit coupled to a sensing clock input terminal and the second power input terminal, the second output circuit outputting an nth sensing signal corresponding to a sensing clock signal supplied to the sensing clock input terminal in response to the voltage of the first node and the voltage of the second node; and a leakage control circuit configured to supply a control voltage supplied to a third input terminal to the first input circuit and the second input circuit in response to the nth scan signal and the nth sensing signal.

The scan driver may further include: a second control circuit configured to hold the voltage of the first node as a gate-off voltage in response to the voltage of the second node; and a third control circuit configured to control the voltage of the second node in response to the scan clock signal and the nth carry signal.

The first and second input circuits, the first to third control circuits, the first and second output circuits, and the leakage control circuit may be configured with oxide semiconductor transistors.

The leakage control circuit may include: a 1Ath transistor coupled between the third input terminal and a third node, the 1Ath transistor having a gate electrode that receives the nth scan signal; and a 1Bth transistor coupled between the third input terminal and the third node, the 1Bth transistor having a gate electrode that receives the nth sensing signal.

The control voltage may be a static voltage that is equal to or larger than a gate-on voltage of the scan clock signal and is smaller than a voltage boosted at the first node.

Each of the first input circuit, the second input circuit, and the second control circuit may include a plurality of transistors coupled in series. The third node may correspond to common nodes of the respective transistors coupled in series. At least one of the 1Ath transistor and the 1Bth transistor may supply the control voltage to the third node.

The first input circuit may include a plurality of second transistors coupled in series between the first input terminal and the first node, the plurality of second transistors having gate electrodes commonly coupled to the first input terminal. A common node of the second transistors may be electrically coupled to the third node.

The second input circuit may include a plurality of third transistors coupled in series between the first node and the second input terminal, the plurality of third transistors having gate electrodes commonly coupled to the second input terminal. A common node of the third transistors may be electrically coupled to the third node.

According to another exemplary embodiment, there is provided a scan driver including a plurality of stages each configured to output a scan signal, wherein an nth (n is a natural number) stage includes: a plurality of second transistors coupled in series between a first input terminal to which a carry signal of a previous stage is supplied and a first node, the plurality of second transistors having gate electrodes commonly coupled to the first input terminal; a plurality of third transistors coupled in series between the first node and a second power input terminal to which a second power source is supplied, the plurality of third transistors having gate electrodes commonly coupled to a second input terminal to which a carry signal of a next stage is supplied; a fifth transistor coupled between a clock input terminal to which a scan clock signal is supplied and a first output terminal that outputs an nth scan signal, the fifth transistor having a gate electrode coupled to the first node; a sixth transistor coupled between the first output terminal and a first power input terminal to which a first power source is supplied, the sixth transistor having a gate electrode coupled to a second node; and a first transistor coupled between a third input terminal to which a control voltage is supplied and a third node, the first transistor having a gate electrode that receives the nth scan signal, wherein a common node of the second transistors and a common node of the third transistors are electrically coupled to the third node.

The control voltage may be a static voltage that is equal to or larger than a gate-on voltage of the scan clock signal supplied to the clock input terminal and is smaller than a voltage boosted at the first node.

The scan driver may further include a fourth transistor coupled between the first output terminal and the first power input terminal, the fourth transistor having a gate electrode coupled to the second input terminal. The fourth transistor may discharge a voltage of the first output terminal as the voltage of the first power source.

The scan driver may further include: a seventh transistor coupled between the clock input terminal and a carry output terminal that outputs an nth carry signal, the seventh transistor having a gate electrode coupled to the first node; an eighth transistor coupled between the carry output terminal and the second power input terminal, the eighth transistor having a gate electrode coupled to the second node; and a capacitor coupled between the first node and the first output terminal.

The scan driver may further include a plurality of ninth transistors coupled in series between the first node and the second power input terminal, the plurality of ninth transistors having gate electrodes commonly coupled to the second node. A common node of the ninth transistors may be electrically coupled to the third node.

The scan driver may further include: a tenth transistor coupled between the clock input terminal and the second node; an eleventh transistor coupled between the second node and the second power input terminal; and twelfth and thirteenth transistors coupled in series between the clock input terminal and the first power input terminal. A gate electrode of the tenth transistor may be coupled to a common node of the twelfth and thirteenth transistors, a gate electrode of the twelfth transistor may be coupled to the clock input terminal, and gate electrodes of the eleventh transistor and the thirteenth transistor may be commonly coupled to the carry output terminal.

The first power source and the second power source may be set to a gate-off voltage. A voltage level of the second power source may be smaller than that of the first power source.

The scan driver may further include: a fourteenth transistor coupled between a sensing clock input terminal to which a sensing clock signal is supplied and a second output terminal that outputs an nth sensing signal, the fourteenth transistor having a gate electrode coupled to the first node; and a fifteenth transistor coupled between the second output terminal and the second power input terminal, the fifteenth transistor having a gate electrode coupled to the second node.

According to still another exemplary embodiment, there is provided a scan driver including a plurality of stages each configured to output a scan signal, wherein an nth (n is a natural number) stage includes: a first input circuit configured to control a voltage of a first node in response to a carry signal of a previous stage, which is supplied to a first input terminal; a second input circuit configured to control the voltage of the first node in response to a carry signal of a next stage, which is supplied to a second input terminal; a first control circuit configured to control a voltage of an output terminal that outputs an nth scan signal in response to the carry signal of the next stage; an output circuit coupled to a clock input terminal, a first power input terminal to which a first power source is supplied, and a second power input terminal to which a second power source is supplied, the output circuit outputting the nth scan signal and an nth carry signal respectively to the output terminal and a carry output terminal in response to the voltage of the first node and a voltage of a second node; and a leakage control circuit configured to supply a control voltage to a third input terminal to the first input circuit and the second input circuit in response to one of the nth scan signal and the nth carry signal.

The leakage control circuit may include a first transistor coupled between the third input terminal and a third node, the first transistor having a gate electrode that receives the nth scan signal.

The control voltage may be a static voltage that is equal to or larger than a gate-on voltage of a scan clock signal supplied to the clock input terminal and is smaller than a voltage boosted at the first node.

The control voltage may be equal to the scan clock signal supplied to the clock input terminal.

The scan driver may further include: a second control circuit configured to hold the voltage of the first node as a gate-off voltage in response to the voltage of the second node; and a third control circuit configured to control the voltage of the second node in response to the scan clock signal and the nth carry signal.

According to still another exemplary embodiment, there is provided a display device including: a plurality of pixels respectively coupled to scan lines, sensing lines, read-out lines, and data lines; a scan driver including a plurality of stages to supply a scan signal and a sensing signal respectively to the scan lines and the sensing lines; a data driver configured to supply a data signal to the data lines; and a compensator configured to generate a compensation value for compensating for degradation of the pixels, based on sensing values provided from the read-out lines, wherein an nth (n is a natural number) stage among the stages includes: a first input circuit configured to precharge a voltage of a first node in response to a carry signal of a previous stage, which is supplied to a first input terminal; a second input circuit configured to discharge the voltage of the first node in response to a carry signal of a next stage, which is supplied to a second input terminal; a first control circuit configured to discharge a voltage of a first output terminal that outputs an nth carry signal in response to the carry signal of the next stage; a first output circuit coupled to a scan clock input terminal and a carry clock input terminal, the first output circuit outputting an nth scan signal corresponding to a scan clock signal supplied to the scan clock input terminal and the nth carry signal corresponding to a carry clock signal supplied to the carry clock input terminal respectively to the first output terminal and a carry output terminal in response to the voltage of the first node and a voltage of a second node; a second output circuit coupled to a sensing clock input terminal, the second output circuit outputting, to a second output terminal, an nth sensing signal corresponding to a sensing clock signal supplied to the sensing clock input terminal, in response to the voltage of the first node and the voltage of the second node; and a leakage control circuit configured to supply a control voltage supplied to a third input terminal to the first input circuit and the second input circuit in response to the nth scan signal and the nth sensing signal, wherein the pixels and the scan driver are configured with oxide semiconductor transistors.

The leakage control circuit may include: a 1Ath transistor coupled between the third input terminal and a third node, the 1Ath transistor having a gate electrode that receives the nth scan signal; and a 1Bth transistor coupled between the third input terminal and the third node, the 1Bth transistor having a gate electrode that receives the nth sensing signal. The leakage control circuit may prevent a leakage current of the first input circuit, the second input circuit, and the second control circuit from the first node. The control voltage may be a static voltage that is equal to or larger than a gate-on voltage of the scan clock signal and is smaller than a voltage boosted at the first node.

The scan clock signal, the carry clock signal, and the sensing clock signal may be output at the same timing in a display period, and be output at different timings in a sensing period.

The nth stage may further include: a second control circuit configured to hold the voltage of the first node as a gate-off voltage in response to the voltage of the second node; and a third control circuit configured to transfer the scan clock signal to the second node in response to the scan clock signal and then supply the gate off voltage to the second node in response to the nth carry signal.

In the scan driver according to the present disclosure, the control voltage having a high potential is supplied to the third node of a corresponding stage in response to the scan signal and the sensing signal, so that current leakage from the first node to the transistors coupled thereto can be minimized. Thus, a scan driver strong against a threshold voltage change due to degradation of the transistors included in the stage can be implemented.

Further, the stable output of a scan signal and a sensing signal can be ensured even the display device including the oxide semiconductor transistor is used for a long time, and the reliability of the display device can be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
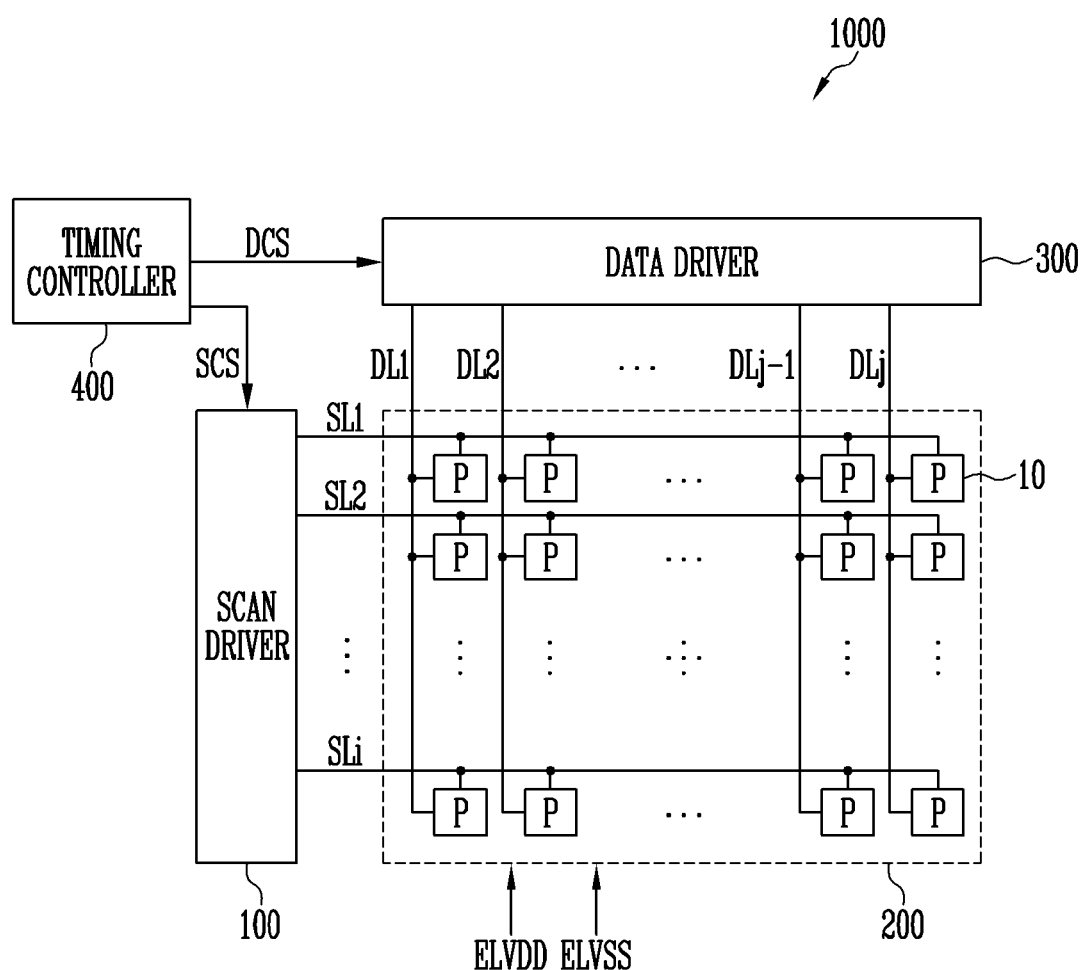
FIG. 1 is a block diagram illustrating a display device according to an embodiment.

In the following description, for the purposes of explanation, numerous specific details are set forth in order to provide a thorough understanding of various exemplary embodiments or implementations of the invention. As used herein "exemplary embodiments" and "exemplary implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram illustrating a display device according to an embodiment.

Referring to FIG. 1, the display device 1000 may include a scan driver 100, a pixel unit 200, a data driver 300, and a timing controller 400.

The display device 1000 may be implemented with an organic light emitting display, a liquid crystal display, a quantum dot display, or the like. The display device 1000 may be a flat panel display, a flexible display, a curved display, a foldable display, or a bendable display. Also, the display device 1000 may be applied to a transparent display, a head-mounted display, a wearable display, and the like.

The timing controller 400 may generate a data driving control signal DCS and a scan driving control signal SCS, corresponding to synchronization signals supplied from the outside. The data driving control signal DCS generated by the timing controller 400 may be supplied to the data driver 300, and the scan driving control signal SCS generated by the timing controller 400 may be supplied to the scan driver 100.

A source start signal and clock signals may be included in the data driving control signal DCS. The source start signal controls a sampling start time of data. The clock signals may be used to control a sampling operation.

A scan start signal and clock signals may be included in the scan driving control signal SCS. The scan start signal controls a first timing of a scan signal. The clock signals may be used to shift the scan start signal.

The scan driver 100 may receive the scan driving control signal SCS from the timing controller 400. The scan driver 100 supplied with the scan driving control signal SCS supplies a scan signal to scan lines SL1 to SLi (i is a natural number). In an example, the scan driver 100 may sequentially supply the scan signal to the scan lines SL1 to SLi. When the scan signal is sequentially supplied to the scan lines SL1 to SLi, pixels 10 may be selected in units of horizontal lines. To this end, the scan signal may be set to a gate-on voltage (e.g., a logic high level) such that transistors included in the pixels 10 can be turned on.

The data driver 300 may be supplied with the data driving control signal DCS from the timing controller 400. The data driver 300 supplied with the data driving control signal DCS may supply a data signal to data lines DL1 to DLj (j is a natural number). The data signal supplied to the data lines DL1 to DLj may be supplied to the pixels 10 selected by the scan signal. To this end, the data driver 300 may supply the data signal to the data lines DL1 to DLj to be synchronized with the scan signal.

The pixel unit 200 includes pixels 10 coupled to the scan lines SL1 to SLi and the data lines DL1 to DLj. The pixel unit 200 may be supplied with a first driving power source ELVDD and a second driving power source ELVSS from the outside.

Meanwhile, although i scan lines SL1 to SLi are illustrated in FIG. 1, the present disclosure is not limited thereto. In an example, one or more scan lines, one or more emission control lines, one or more read-out lines, one or more sensing lines, and the like may be additionally formed in the pixel unit 200, corresponding to a circuit structure of the pixel 10.

In an embodiment, transistors included in the display device 1000 may be implemented with an N-type oxide thin film transistor. For example, the oxide thin film transistor may be a Low Temperature Polycrystalline Oxide (LTPO) thin film transistor. However, this is merely illustrative, and N-type transistors are not limited thereto. For example, an active pattern (semiconductor layer) included in the transistors may include inorganic silicon (e.g., amorphous silicon), poly silicon, organic semiconductor, etc.

However, this is merely illustrative, and at least one of the transistors included in the display device 1000 may be replaced with a P-type transistor. For example, the P-type transistor may be a P-channel Metal Oxide Semiconductor (PMOS) transistor.

Figure 2:
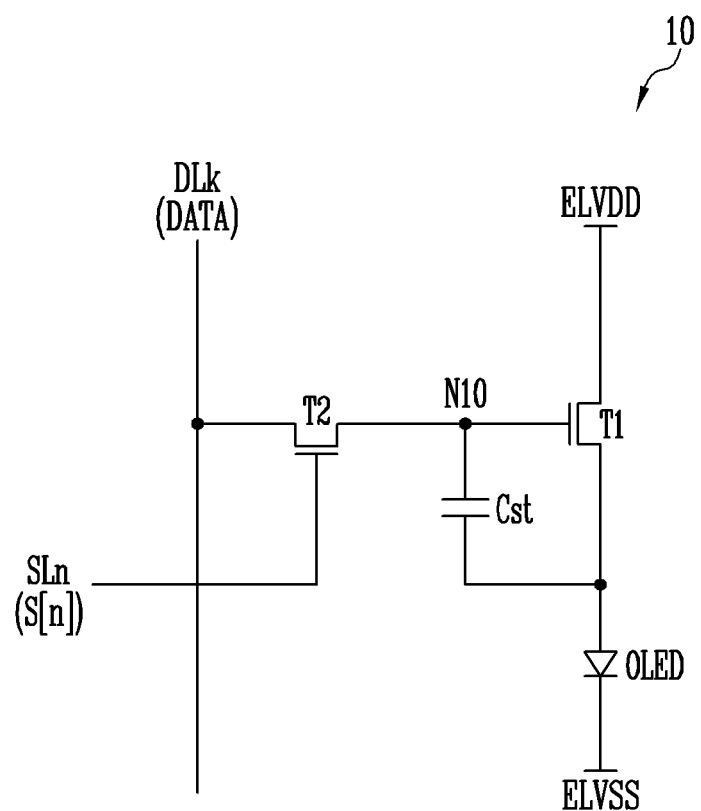
FIG. 2 is a circuit diagram illustrating an example of a pixel included in the display device of FIG. 1.

FIG. 2 is a circuit diagram illustrating an example of the pixel 10 included in the display device of FIG. 1.

Referring to FIG. 2, the pixel 10 may include an organic light emitting diode OLED, a first transistor (driving transistor) T1, a second transistor T2, and a storage capacitor Cst.

An anode electrode of the organic light emitting diode OLED may be coupled to a second electrode of the first transistor T1, and a cathode electrode of the organic light emitting diode OLED may be coupled to a second driving power source ELVSS. The organic light emitting diode OLED generates light with a predetermined luminance corresponding to an amount of current supplied from the first transistor T1.

A first electrode of the first transistor T1 may be coupled to a first driving power source ELVDD, and the second electrode of the first transistor T1 may be coupled to the anode electrode of the organic light emitting diode OLED. A gate electrode of the first transistor T1 may be coupled to a tenth node N10. The first transistor T1 controls an amount of current flowing through the organic light emitting diode OLED, corresponding to a voltage of the tenth node N10.

A first electrode of the second transistor T2 may be coupled to a data line DLk, and a second electrode of the second transistor T2 may be coupled to the tenth node N10. A gate electrode of the second transistor T2 may be turned on when a scan signal S[n] is supplied to a scan line SLn, to transfer a data signal (data voltage DATA) from the data line DLk to the tenth node N10.

The storage capacitor Cst may be coupled between the tenth node N10 and the anode electrode of the organic light emitting diode OLED. The storage capacitor Cst stores the voltage of the tenth node N10.

Meanwhile, in the embodiment of the present disclosure, the pixel 10 is not limited to the circuit structure shown in FIG. 2. For example, the pixel 10 may be implemented with various types of circuits supplied with at least one of a scan signal, an emission control signal, and a sensing signal.

Figure 3:
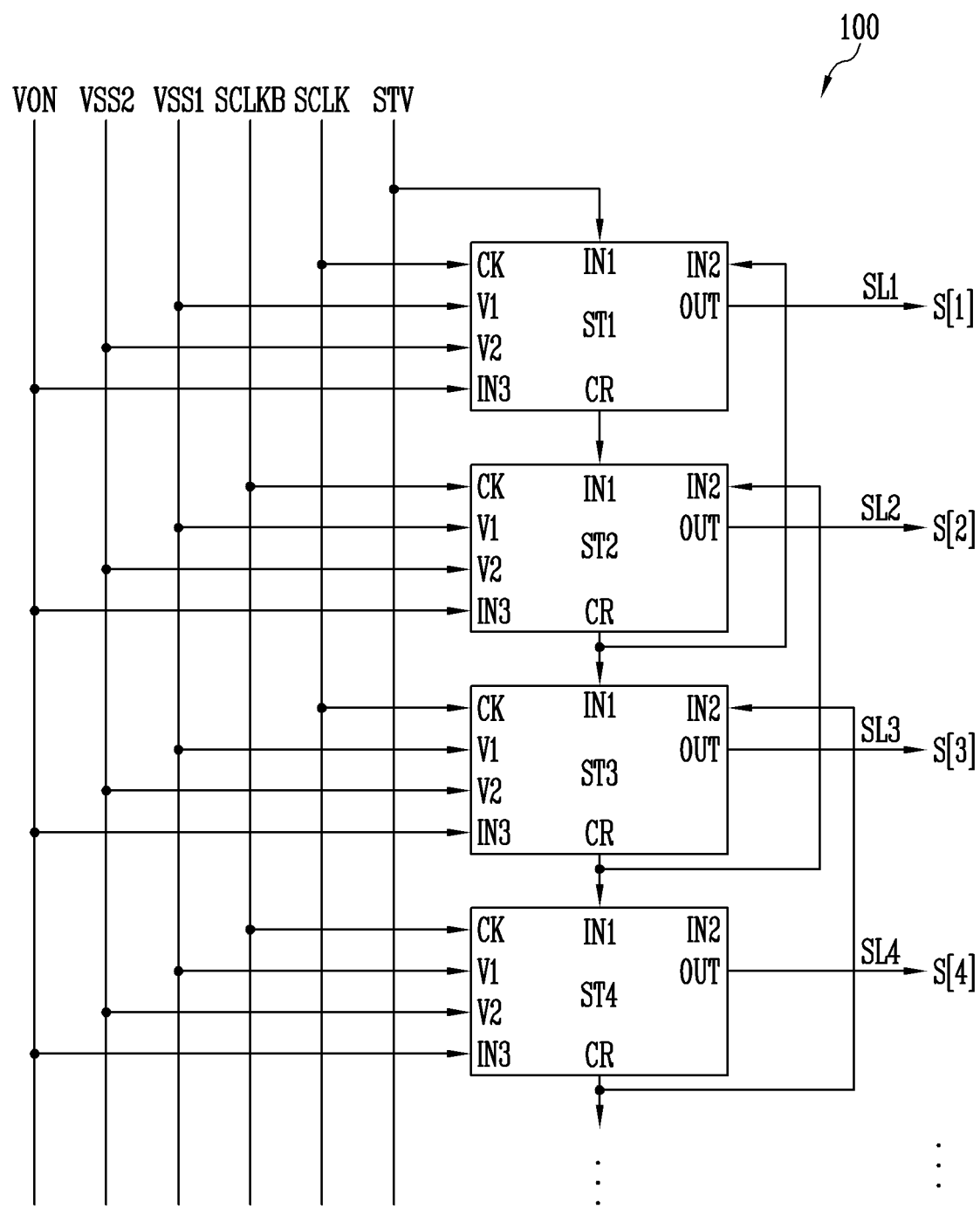
FIG. 3 is a diagram illustrating an example of a scan driver according to an embodiment.

FIG. 3 is a diagram illustrating an example of a scan driver according to an embodiment of the present disclosure.

Referring to FIG. 3, the scan driver 100 may include a plurality of stages ST1, ST2, ST3, ST4, . . . .

The stages ST1, ST2, ST3, ST4, . . . may respectively output scan signals S[1], S[2], S[3], S[4], . . . in response to a scan start signal STV. For example, an nth stage may output an nth scan signal to an nth scan line. The scan start signal for controlling a timing of a first scan signal may be supplied to a first stage ST1.

Each of the stages ST1, ST2, ST3, ST4, . . . may include a first input terminal IN1, a second input terminal IN2, a third input terminal IN3, a scan clock input terminal CK (or a clock input terminal), a first power input terminal V1, a second power input terminal V2, a carry output terminal CR, and an output terminal OUT.

Each of the stages ST1, ST2, ST3, ST4, . . . may be supplied with a first scan clock signal SCLK or a second scan clock signal SCLKB through the scan clock input terminal CK. For example, odd-numbered stages ST1, ST3, . . . may receive the first scan clock signal SCLK, and even-numbered stages ST2, ST4, . . . may receive the second scan clock signal SCLKB.

The first scan clock signal SCLK may be set as a square wave signal in which a logic high level and a logic low level are repeated. The logic high level may correspond to a gate-on voltage, and the logic low level may correspond to a gate-off voltage. For example, the logic high level may be a voltage value between about 10 V and about 30 V, and the logic low level may be a voltage value between −16 V and about −3 V.

The second scan clock signal SCLKB may be set as a square wave signal in which the logic high level and the logic low level are repeated. The second scan clock signal SCLKB may be set as a signal that has a period equal to that of the first scan clock signal SCLK and has a phase inverted from that of the first scan clock signal SCLK. However, this is merely illustrative, and the waveform relationship between the first scan clock signal SCLK and the second scan clock signal SCLKB is not limited thereto. For example, a portion of the period in which the first scan clock signal SCLK has the logic high level and a portion of the period in which the second scan clock signal SCLKB has the logic high level may overlap with each other.

In addition, the number of scan clock signals supplied to one stage is not limited thereto. For example, two or more clock signals may be applied to each of the stages ST1, ST2, ST3, ST4, . . . .

The first input terminal IN1 may receive the scan start signal STV or a carry signal of a previous stage. That is, the scan start signal STV may be supplied to the first input terminal IN1 of the first stage ST1, and a carry signal of a previous stage may be applied to the first input terminal IN1 of each of the stages except the first stage ST1.

The second input terminal IN2 may receive a carry signal of a next stage. For example, the carry signal of the next stage may be one of carry signals supplied after a predetermined time after a carry signal of a current stage is output.

The third input terminal IN3 may receive a control voltage VON. In an embodiment, the control voltage VON may be a high-potential voltage to be supplied to a source electrode of a predetermined transistor included in each of the stages ST1, ST2, ST3, . . . . For example, the control voltage VON may be a voltage near the logic high level (gate-on voltage) of the first scan clock signal SCLK. The control voltage VON may have a voltage value between about 10 V and about 30 V.

In an embodiment, the control voltage VON may be equal to the scan clock signal SCLK or SCLKB. For example, each of the stages ST1, ST2, ST3, . . . may receive the same clock signal through the scan clock input terminal CK and the third input terminal IN3.

The carry output terminal CR may output a carry signal. The carry signal may be provided to the first input terminal IN1 of a next stage.

The output terminal OUT may output a scan signal. The scan signal may be supplied to a pixel through a scan line corresponding thereto.

The first power input terminal V1 may be supplied with a first power source VSS1, and the second power input terminal V2 may be supplied with a second power source VSS2. The first power source VSS1 and the second power source VSS2 may be set to the gate-off voltage. In an embodiment, the first power source VSS1 and the second power source VSS2 may be equal to each other. Also, in an embodiment, the second power source VSS2 may have a voltage level smaller than that of the first power source VSS1. For example, the first power source VSS1 may be set within a range of about −14 V to about −1 V, and the second power source VSS2 may be set within a range of about −16 V to about −3 V.

Figure 4:
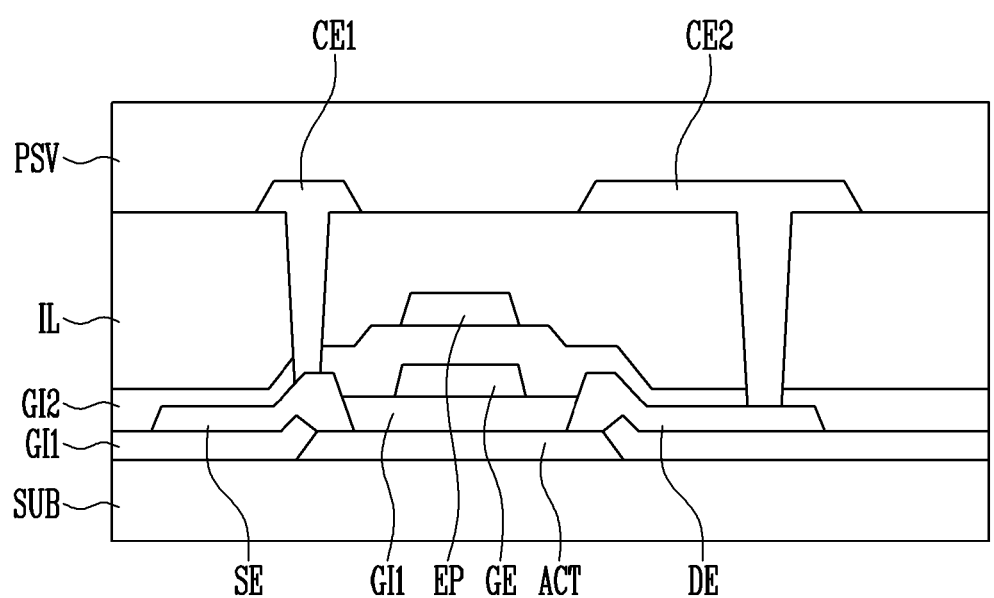
FIG. 4 is a sectional view illustrating an example of a transistor included in the display device of FIG. 1.

FIG. 4 is a sectional view illustrating an example of a transistor included in the display device of FIG. 1.

Referring to FIG. 4, a transistor included in the pixel or the scan driver may be a thin film transistor having a top-gate structure.

A substrate SUB may be a rigid substrate or flexible substrate. The substrate SUB may be one of a glass substrate, a quartz substrate, a glass ceramic substrate, and a film substrate and a plastic substrate, which include a polymer organic material.

In an embodiment, a buffer layer and/or a barrier layer may be disposed on the substrate SUB. The buffer layer and/or the barrier layer may include a silicon oxide ($SiO_X$), a silicon nitride ($SiN_X$), a silicon oxynitride ($SiO_XN_Y$), etc. The buffer layer and/or the barrier layer may have a single- or multi-layered structure including a silicon compound.

An active layer ACT that is a semiconductor layer may be formed on the substrate SUB. The active layer ACT may include a channel region, and a source region and a drain region, which are respectively formed at both sides of the channel region. For example, the active layer ACT may include an oxide semiconductor such as Indium Gallium Zinc Oxide (IGZO), Zinc Tin Oxide (ZTO), or Indium Tin Zinc Oxide (ITZO).

A first gate insulating layer GI1 may be provided on the substrate SUB on which the active layer ACT is formed. The first gate insulating layer GI1 may include at least one of an organic insulating layer and an inorganic insulating layer.

A gate electrode GE may be formed on the first gate insulating layer GI1 to overlap with the channel region of the active layer ACT. In an embodiment, a source electrode SE coupled to the source region of the active layer ACT through a first contact hole and a drain electrode DE coupled to the drain region of the active layer ACT through a second contact hole may be formed on the first gate insulating layer GI1. In an embodiment, the gate electrode GE, the source electrode SE, and the drain electrode DE may be formed of the same material through the same process. For example, the gate electrode GE, the source electrode SE, and the drain electrode DE may include a metal, an alloy, a metal nitride, a conductive metal oxide, a transparent conductive material, etc.

A second gate insulating layer GI2 covering the gate electrode GE, the source electrode SE, and the drain electrode DE may be provided on the first gate insulating layer GI1. The second gate insulating layer GI2 may include at least one of an organic insulating layer and an inorganic insulating layer.

An upper electrode pattern EP overlapping with the gate electrode GE may be formed on the second gate insulating layer GI2. In an embodiment, the upper electrode pattern EP and the gate electrode GE may form the storage capacitor Cst of FIG. 2 of the pixel 10 of FIG. 2. The upper electrode pattern EP may include a metal, an alloy, a metal nitride, a conductive metal oxide, a transparent conductive material, etc.

An insulating interlayer IL may be provided on the second gate insulating layer GI2 on which the upper electrode pattern EP is disposed. The insulating interlayer IL may include at least one of an organic insulating layer and an inorganic insulating layer.

A first connecting electrode CE1 and a second connecting electrode CE2, which penetrate the insulating interlayer IL and the second gate insulating layer GI2 may be disposed on the insulating interlayer IL. For example, the first connecting electrode CE1 may be coupled to the source electrode SE, and the second connecting electrode CE2 may be coupled to the drain electrode DE. The first and second connecting electrodes CE1 and CE2 may include a low-resistance metal. For example, the low-resistance metal may have an aluminum alloy structure in which titanium (Ti), aluminum (Al), and titanium (Ti) are sequentially stacked. However, this is merely illustrative, and the low-resistance metal is not limited thereto.

A protective layer PSV may be provided on the insulating interlayer IL on which the first connecting electrode CE1 and the second connecting electrode CE2 are disposed. The protective layer PSV may include at least one of an organic insulating layer and an inorganic insulating layer.

As described above, the transistor included in the display device and the scan driver according to the embodiment of the present disclosure may be implemented with an oxide semiconductor transistor having a top-gate structure.

However, this is merely illustrative, and the structure of the transistor is not limited thereto. For example, the transistor may have a bottom-gate structure.

Figure 5:
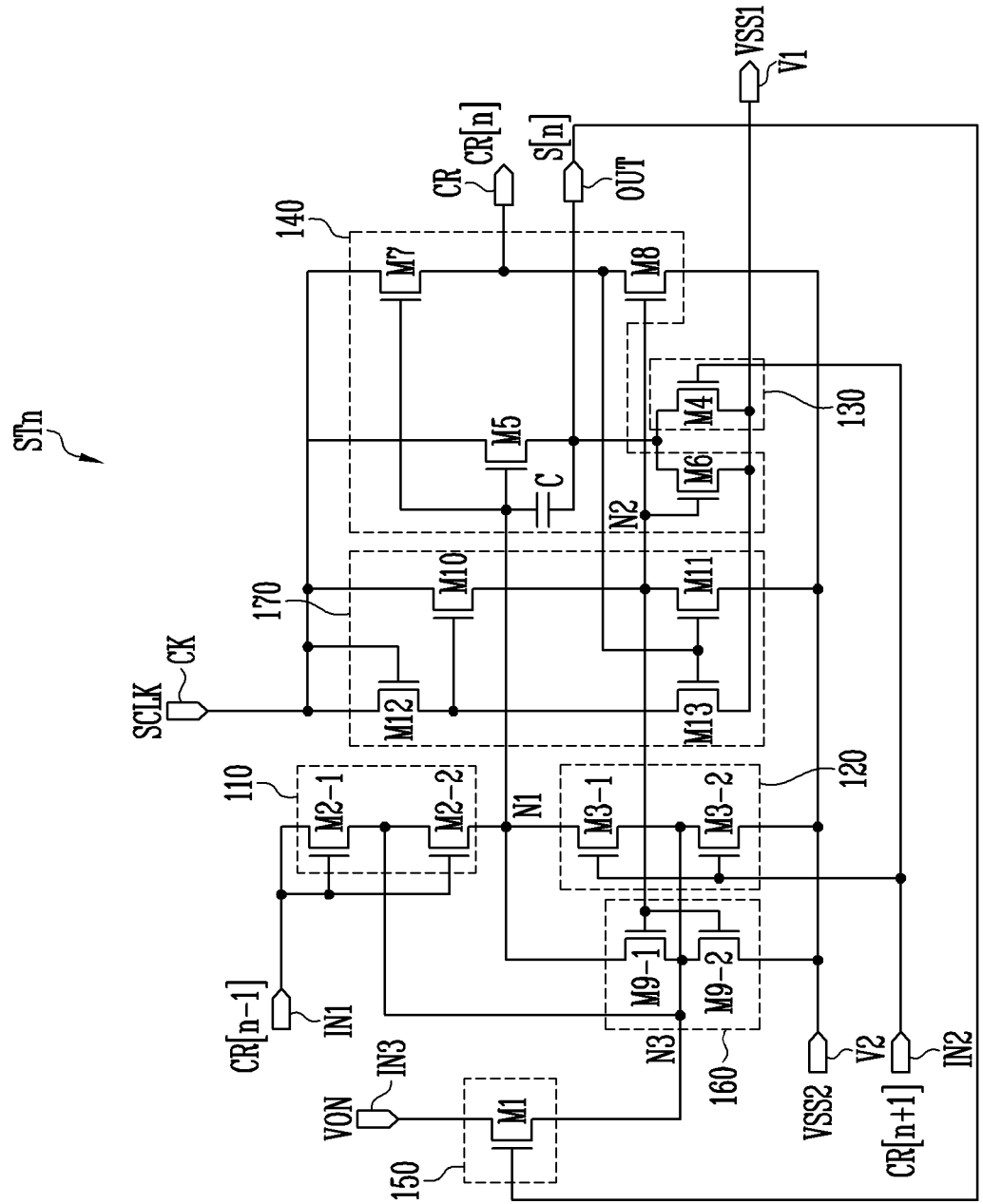
FIG. 5 is a circuit diagram illustrating an example of a stage included in the scan driver of FIG. 3.

FIG. 5 is a circuit diagram illustrating an example of a stage included in the scan driver of FIG. 3.

Referring to FIG. 3 and FIG. 5, an nth stage STn (n is a natural number) may include a first input circuit 110, a second input circuit 120, a first control circuit 130, an output circuit 140, and a leakage control circuit 150. In an embodiment, the nth stage STn may further include a second control circuit 160 and a third control circuit 170.

In an embodiment, transistors included in the nth stage STn may be oxide semiconductor transistors. That is, a semiconductor layer (active pattern) of the transistors may be formed of an oxide semiconductor.

The first input circuit 110 may control a voltage of a first node N1 in response to a carry signal CR[n−1] of a previous stage, which is supplied to a first input terminal IN1, or the scan start signal STV of FIG. 3. The voltage of the first node N1 is a voltage for controlling an output of an nth scan signal S[n] and an nth carry signal CR[n]. For example, the voltage of the first node N1 is a voltage for controlling pull-up of the nth scan signal S[n] and the nth carry signal CR[n].

In an embodiment, the first input circuit 110 may include a plurality of second transistors M2-1 and M2-2 coupled in series between the first input terminal IN1 and the first node N1. Gate electrodes of the second transistors M2-1 and M2-2 may be commonly coupled to the first input terminal IN1. That is, the second transistors M2-1 and M2-2 may have a dual gate structure, and each of the second transistors M2-1 and M2-2 may have a diode-coupling structure. The first input circuit 110 may a gate-on voltage (e.g., a logic high level) of an (n−1)th carry signal CR[n−1] to the first node N1. For example, the first input circuit 110 may precharge the voltage of the first node N1, using the gate-on voltage of the (n−1)th carry signal CR[n−1].

A common node (e.g., a source electrode of the second transistor M2-1 and a drain electrode of the second transistor M2-2) between the second transistors M2-1 and M2-2 may correspond to a third node N3. The common node between the second transistors M2-1 and M2-2 may be electrically coupled to the third node N3.

The voltage of the first node N1 may be a high voltage having a level of the gate-on voltage. In this case, a leakage current from the first node N1 to the first input circuit 110 may be generated when a voltage of the common node between the second transistors M2-1 and M2-2 is lower than a predetermined reference. Also, when a threshold voltage is negative-shifted due to degradation of the second transistors M2-1 and M2-2, a leakage current from the first node N1 to the first input circuit 110 may be generated.

In particular, the threshold voltage Vth of the oxide semiconductor transistor may be moved to a negative value (negative-shifted) due to degradation, etc. A leakage current increases in a turn-off state of the oxide semiconductor transistor, and therefore, the stage circuit may abnormally operate.

A high voltage having a level of the gate-on voltage is applied to the common node between the second transistors M2-1 and M2-2 in a state in which the first node N1 is charged with the gate-on voltage. The (n−1)th carry signal CR[n−1] has a gate-off voltage, and the gate-off voltage may be supplied to the gate electrodes of the second transistors M2-1 and M2-2. Thus, a gate-source voltage Vgs of the second transistor M2-2 can be maintained as a very low value (e.g., a negative value), and current leakage from the first node N1 to the first input circuit 110 can be prevented even when the second transistors M2-1 and M2-2 are degraded.

The second input circuit 120 may control the voltage of the first node N1 in response to a carry signal of a next stage (e.g., an (n+1)th carry signal CR[n+1]). In an embodiment, the second input circuit 120 may provide the voltage of a second power source VSS2 to the first node N1 in response to the (n+1)th carry signal CR[n+1]. For example, the second input circuit 120 may discharge the voltage of the first node N1 having a predetermined high-potential voltage.

The second input circuit 120 may include a plurality of third transistors M3-1 and M3-2 coupled in series between the first node N1 and a second power input terminal V2. Gate electrodes of the third transistors M3-1 and M3-2 may be commonly coupled to a second input terminal IN2.

A common node between the third transistors M3-1 and M3-2 may be electrically coupled to the third node N3. In other words, the common node between the third transistors M3-1 and M3-2 may correspond to the third node N3.

The first control circuit 130 may control a voltage of a output terminal OUT that outputs the nth scan signal S[n] in response to the (n+1)th carry signal CR[n+1]. A voltage of a second node N2 may control the state of the gate-off voltage (logic low level) of the nth scan signal S[n] and the nth carry signal CR[n]. For example, the voltage of the second node N2 is a voltage for controlling pull-down of the nth scan signal S[n] and the nth carry signal CR[n].

In an embodiment, the first control circuit 130 may provide a first power source VSS1 to the output terminal OUT in response to the (n+1)th carry signal CR[n+1].

In an embodiment, the first control circuit 130 may include a fourth transistor M4 coupled between the output terminal OUT and a first power input terminal V1. A gate electrode of the fourth transistor M4 may be coupled to the second input terminal IN2. The fourth transistor M4 may discharge a voltage of the output terminal OUT as the voltage of the first power source VSS1.

The output circuit 140 may be coupled to a scan clock input terminal CK, the first power input terminal V1, and the second power input terminal V2. The output circuit 140 may output the nth scan signal S[n] and the nth carry signal CR[n], which correspond to a scan clock signal SCLK, respectively to the output terminal OUT and a carry output terminal CR. In an embodiment, the output circuit 140 may include fifth to eighth transistors M5 to M8 and a capacitor C.

The fifth transistor M5 may be coupled between the scan clock input terminal CK and the output terminal OUT. The fifth transistor M5 may include a gate electrode coupled to the first node N1. The fifth transistor M5 may supply the gate-on voltage to the output terminal OUT in response to the voltage of the first node N1. For example, the fifth transistor M5 may serve as a pull-up buffer.

The sixth transistor M6 may be coupled between the output terminal OUT and the first power input terminal V1. The sixth transistor M6 may include a gate electrode coupled to the second node N2. The sixth transistor M6 may supply the gate-off voltage to the output terminal OUT in response to the voltage of the second node N2. For example, the sixth transistor M6 may hold the voltage of the output terminal OUT as a gate-off voltage level (or logic low level).

The seventh transistor M7 may be coupled between the scan clock input terminal CK and the carry output terminal CR. The seventh transistor M7 may include a gate electrode coupled to the first node N1. The seventh transistor M7 may supply the gate-on voltage to the carry output terminal CR in response to the voltage of the first node N1. For example, the seventh transistor M7 may serve as a pull-up buffer.

The eighth transistor M8 may be coupled between the carry output terminal CR and the first power input terminal V1. The eighth transistor M8 may include a gate electrode coupled to the second node N2. The eighth transistor M8 may supply the gate-off voltage to the carry output terminal CR in response to the voltage of the second node N2. For example, the eighth transistor M8 may hold a voltage of the carry output terminal CR as the gate-off voltage level (i.e., the logic low level).

The capacitor C may be coupled between the first node N1 and the output terminal OUT. The capacitor C may serve as a boosting capacitor. That is, the capacitor C may increase (bootstrap) the voltage of the first node N1, corresponding to an increase of voltage of the output terminal OUT when the fifth transistor M5 is turned on. Accordingly, the fifth transistor M5 can stably maintain a turn-on state during a predetermined period.

The second control circuit 160 may hold the voltage of the first node N1 as a predetermined gate-off voltage in response to the voltage of the second node N2. In an embodiment, the second control circuit 160 may provide the voltage (i.e., the gate-off voltage) of the second power source VSS to the first node N1 in response to the voltage of the second node N2.

In an embodiment, the second control circuit 160 may include ninth transistors M9-1 and M9-2 coupled in series between the first node and the second power input terminal V2. Gate electrodes of the ninth transistors M9-1 and M9-2 may be commonly coupled to the second node N2.

A common node between the ninth transistors M9-1 and M9-2 may be electrically coupled to the third node N3. In other words, the common node between the ninth transistors M9-1 and M9-2 may correspond to the third node N3.

Meanwhile, although two second transistors M2-1 and M2-2, two third transistors M3-1 and M3-2, and two ninth transistors M9-1 and M9-2 are illustrated in FIG. 5, the number of transistors coupled in series is not limited thereto. For example, when three or more third transistors M3 are coupled in series, at least one common node between the third transistors M3 may be electrically coupled to the third node N3.

The third control circuit 170 may control the voltage of the second node N2 in response to the scan clock signal SCLK and the nth carry signal CR[n]. In an embodiment, the third control circuit 170 may transfer the scan clock signal SCLK to the second node N2 in response to the scan clock signal SCLK and then supply the gate-off voltage to the second node N2 in response to the nth carry signal CR[n].

The voltage of the second node N2 may control the state of the gate-off voltage (logic low level) of the nth scan signal S[n] and the nth carry signal CR[n]. For example, the voltage of the second node N2 is a voltage for controlling pull-down of the nth scan signal S[n] and the nth carry signal CR[n].

The third control circuit 170 may include tenth to thirteenth transistors M10 to M13.

The tenth transistor M10 may be coupled between the scan clock input terminal CK and the second node N2. A gate electrode of the tenth transistor M10 may be coupled to a common node of the twelfth and thirteenth transistors M12 and M13. The tenth transistor M10 may supply the scan clock signal SCLK to the second node N2 in response to the scan clock signal SCLK.

The eleventh transistor M1l may be coupled between the second node N2 and the second power input terminal V2.

The twelfth and thirteenth transistors M12 and M13 may be coupled in series between the scan clock input terminal CK and the first power input terminal N1. A gate electrode of the twelfth transistor M12 may be coupled to the scan clock input terminal CK. Gate electrodes of the eleventh and thirteenth transistors M11 and M13 may be commonly coupled to the carry output terminal CR.

That is, when the nth carry signal CR[n] is output (i.e., when the nth carry signal CR[n] has the gate-on voltage), the thirteenth transistor M13 may be turned on such that the tenth transistor M10 is turned off, and the eleventh transistor M11 may be turned on such that the voltage of the second power source VSS2 is supplied to the second node N2. Therefore, the second node N2 may have the gate-off voltage when the nth carry signal CR[n] is output.

The second power source VSS2 may have a voltage level smaller than that of the first power source VSS1. That is, the voltage of the second power source VSS2, which is lower than that of the first power source VSS1, may be provided to the second node N2 by an operation of the eleventh transistor M11. This is for the purpose of preventing an unintended operation of the sixth transistor M6 and/or the eighth transistor M8 due to ripples of the voltage of the second node N2 when the voltage of the second node N2 is changed from the gate-on voltage to the gate-off voltage. Therefore, one electrode of the eleventh transistor M11 may be coupled to the second power source VSS2 of which voltage is lower than that of the first power source VSS1.

The leakage control circuit 150 may supply a control voltage VON supplied to a third input terminal IN3 to the first input circuit 110, the second input circuit 120, and the second control circuit 160 in response to one of the nth scan signal S[n] and the nth carry signal CR[n]. In an embodiment, the leakage control circuit 150 may include a first transistor 1 coupled between the third input terminal IN3 and the third node N3. The first transistor M1 may include a gate electrode that receives the nth scan signal S[n].

The first transistor M1 may supply the control voltage VON to common nodes of transistors coupled in series to the first node N1. Accordingly, while the first node N1 is being charged (i.e., when the voltage of the first node N1 is boosted), the control voltage VON having a high potential may be applied to one electrode of the second transistor M2-2, one electrode the third transistor M3-1, and one electrode of the ninth transistor M9-1. That is, a high-potential voltage caused by the control voltage VON may be charged in the third node N3 while the first node N1 is being charged. Therefore, when the voltage of the first node N1 is boosted, the gate-source voltage Vgs of each of the second transistor M2-2, the third transistor M3-1, and the ninth transistor M9-1 may have a negative value. The gate-source voltage Vgs of each of the second transistor M2-2, the third transistor M3-1, and the ninth transistor M9-1 may be maintained as a value much smaller than the threshold voltage. Accordingly, current leakage through the second transistor M2-2, the third transistor M3-1, and the ninth transistor M9-1 can be prevented.

In particular, although the threshold voltage is negative-shifted due to degradation of the transistors configured with the oxide semiconductor, the gate-source voltage Vgs of each of the second transistor M2-2, the third transistor M3-1, and the ninth transistor M9-1 has a value smaller than the negative-shifted threshold voltage, and thus a voltage drop of the first node N1 can be minimized.

Figure 6:
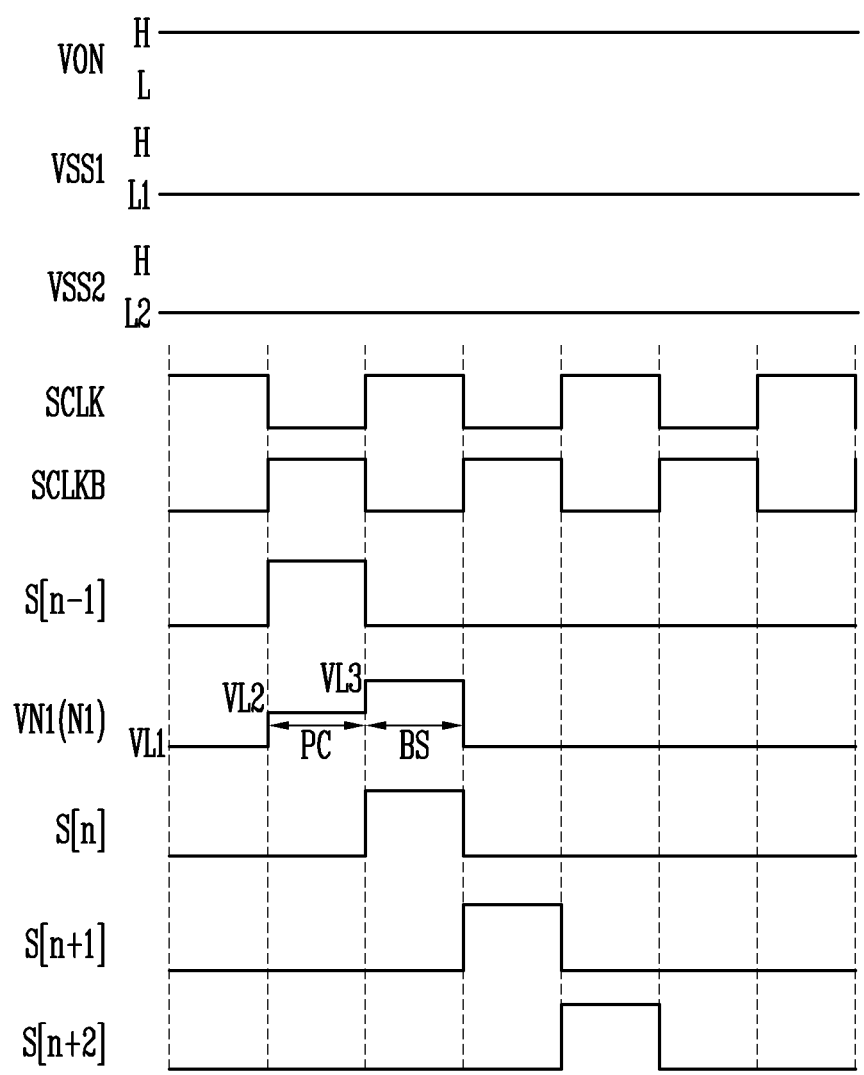
FIG. 6 is a timing diagram illustrating an example of an operation of the stage of FIG. 5.

FIG. 6 is a timing diagram illustrating an example of an operation of the stage of FIG. 5.

Referring to FIGS. 3 to 6, the scan driver 100 including the nth stage STn may sequentially output a scan signal.

In FIG. 6, an operation of the nth stage STn will be mainly described. Also, positions, widths, heights, etc. of waveforms shown in FIG. 6 are merely illustrative, and the present disclosure is not limited thereto.

The first scan clock signal SCLK and the second scan clock signal SCLKB may have the same period and have phases inverted from each other.

The nth stage STn may charge the first node N1, corresponding to the (n−1)th carry signal CR[n−1], and discharge the first node N1 in response to the (n+1)th carry signal CR[n+1].

Each of a voltage L1 of the first power source VSS1 and a voltage L2 of the second power source VSS2 may correspond to a gate-off voltage. In an embodiment, the voltage L2 of the second power source VSS2 may be smaller than that L1 of the first power source VSS1.

A precharging period PC and a bootstrap period BS may be periods in which the first node N1 is charged with a voltage higher than a first voltage level VIA. In periods except the precharging period PC and the bootstrap period BS, a voltage VN1 of the first node N1 may have the first voltage level VL1.

During the precharging period PC, the (n−1)th carry signal CR[n−1] may be supplied to the first input terminal IN1, and the second transistors M2-1 and M2-2 may be turned on. Therefore, a gate-on voltage may be supplied (precharged) to the first node N1. For example, the voltage VN1 of the first node N1 may have a second voltage level VL2 higher than the first voltage level VL1.

When the gate-on voltage is supplied to the first node N1, the fifth and seventh transistors M5 and M7 may be turned on. Therefore, the scan clock input terminal CK and the output terminal OUT may be electrically coupled to each other, and the scan clock input terminal CK and the carry output terminal CR may be electrically coupled to each other. The scan clock signal SCLK has a logic low level (gate-off voltage), and hence the output terminal OUT and the carry output terminal CR may maintain the gate-off voltage.

Subsequently, during the bootstrap period BS, the scan clock signal SCLK having a logic high level may be supplied to the scan clock input terminal CK, and the gate-on voltage may be supplied to the output terminal OUT and the carry output terminal CR by the fifth and seventh transistors M5 and M7 that are in the turn-on state. A signal of the output terminal OUT may be provided as the nth scan signal S[n] to the nth scan line SLn. A signal of the carry output terminal CR may be supplied as the nth carry signal CR[n] to an (n−1)th stage and an (n+1)th stage.

Meanwhile, during the bootstrap period BS, a voltage of one end of the capacitor C, which is coupled to one electrode of the fifth transistor M5, is increased by the scan clock signal SCLK, and hence a voltage of the other end of the capacitor C, which is coupled to the first node N1, may be boosted by the increment. For example, the voltage VN1 of the first node N1 may have a third voltage level VL3 higher than the second voltage level VL2. Accordingly, the fifth and seventh transistors M5 and M7 can stably maintain the turn-on state.

However, when current leakage occurs in the first node N1, a gate voltage of the fifth and seventh transistors M5 and M7 may be decreased, and an output signal of the nth stage STn may be distorted.

In order to prevent this current leakage, the first transistor M1 may be turned on in response to the nth scan signal S[n] during the bootstrap period BS. Therefore, during the bootstrap period BS, the control voltage VON having a high-potential voltage may be supplied to the third node N3 corresponding to the common node of the second transistors M2-1 and M2-2, the common node of the third transistors M3-1 and M3-2, and the common node of the ninth transistors M9-1 and M9-2.

In addition, during the bootstrap period BS, the eleventh and thirteenth transistors M11 and M13 may be turned on by the nth carry signal CR[n] such that the voltage of the second power source VSS2 is supplied to the second node N2.

Subsequently, the scan clock signal SCLK may have the logic low level (gate-off voltage), and the (n+1)th carry signal CR[n+1] having the gate-on voltage may be supplied to the second input terminal IN2.

The third transistors M3-1 and M3-2 may be turned on in response to the (n+1)th carry signal CR[n+1], and the voltage of the second power source VSS2 may be supplied to the first node N1. That is, the voltage VN1 of the first node N1 may be discharged. The voltage of the second power source VSS2 may be a predetermined gate-off voltage at which a transistor is turned off.

In addition, the fourth transistor M4 may be turned on in response to the (n+1)th carry signal CR[n+1]. When the fourth transistor M4 is turned on, the voltage of the first power source VSS1 may be supplied to the output terminal OUT. Therefore, the nth scan signal S[n] has the gate-off voltage.

As described above, the control voltage VON having a high potential is supplied to the third node N3 of the stage STn in response to the scan signal, so that current leakage from the first node N1 to the transistors coupled thereto can be minimized.

Figure 7:
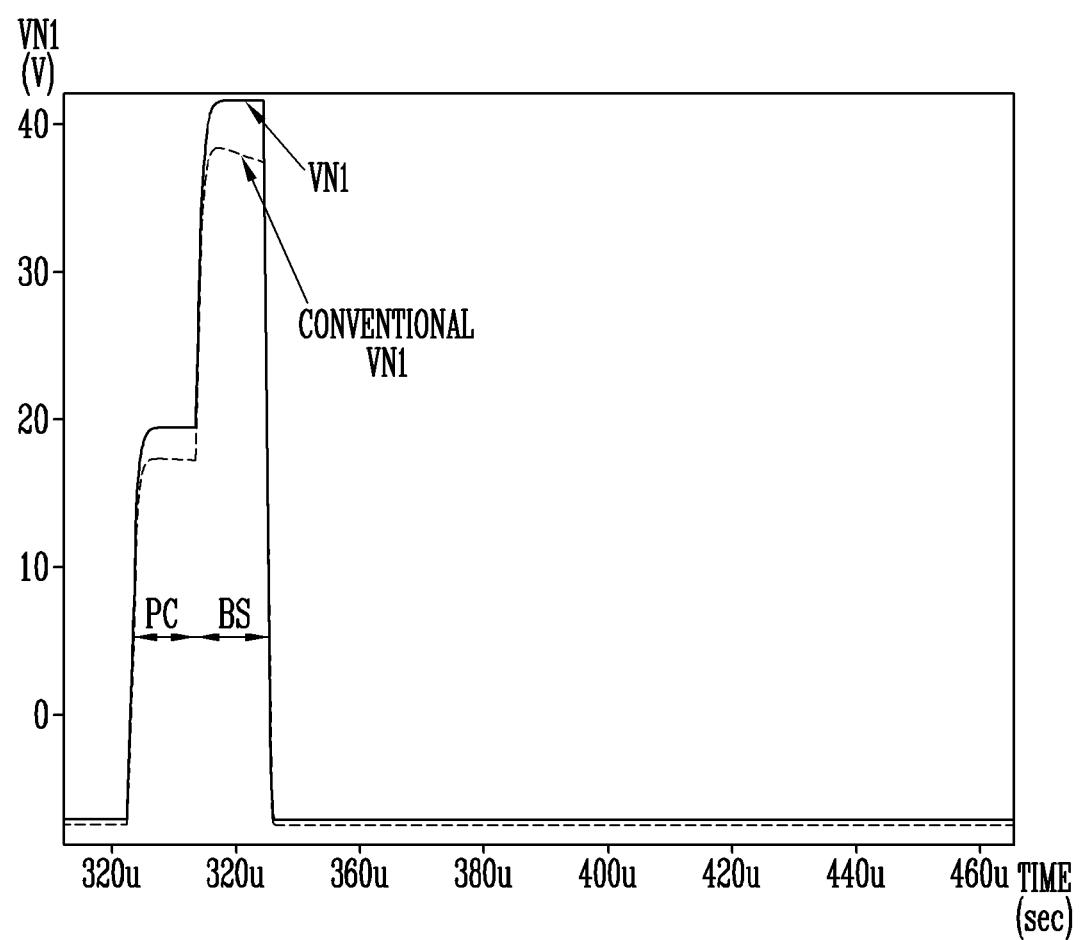
FIG. 7 is a diagram illustrating an example of a voltage change of a first node included in the stage of FIG. 5.

FIG. 7 is a diagram illustrating an example of a voltage change of the first node included in the stage of FIG. 5.

Referring to FIGS. 5 to 7, the voltage VN1 of the first node N1 of the stage may be precharged by the (n−1)th carry signal CR[n−1] in the precharging period PC, and be boosted by the capacitor C in the bootstrap period BS.

Although not shown in FIG. 7, a ripple may occur in the voltage VN1 of the first node N1 after the bootstrap period BS.

In a conventional stage, there was an attempt to suppress a leakage current by applying a voltage to the common nodes (i.e., the third node N3 of FIG. 5) of the transistors. For example, in a conventional method, a carry signal or scan signal output from the nth stage is supplied to the common nodes, using a diode-connected transistor, or a static voltage having a high potential is controlled as the voltage of the first node N1 and is supplied to the common nodes.

However, when the carry signal or the scan signal is supplied to the common nodes, using the diode-coupled transistor, voltage loss and supply delay, which are caused by the diode-coupled transistor, occur. Therefore, current leakage at the first node N1 may considerably occur.

In addition, when the voltage having the high potential is controlled as the voltage of the first node N1 and is supplied to the common nodes, the voltage of the first node N1 is supplied to the gate electrode of the first transistor M1. The voltage of the first node N1, which is boosted by the capacitor C, is excessively increased, and the first transistor M1 may not normally operate.

Thus, the leakage control circuit 150 according to the embodiment of the present disclosure provides a static voltage having a high potential to the common nodes by supplying a scan signal to the gate electrode of the first transistor M1, so that the above-described two problems can be solved.

As described above, the stage according to the embodiment of the present disclosure includes the leakage control circuit 150 that supplies the control voltage VON to the third node N3 in response to the scan signal S[n], so that the control voltage VON having a high potential can be rapidly supplied to the third node N3 without voltage loss and degradation of the reliability of the first transistor M1. Thus, as shown in FIG. 7, leakage current in the precharging period PC and the bootstrap period BS is minimized, and the voltage VN1 of the first node N1 in the precharging period PC and the bootstrap period BS can be increased by 10% or more and maintained as compared with the conventional art. Accordingly, a stable scan signal can be output regardless of degradation of the transistors included in the stage.

Figure 8:
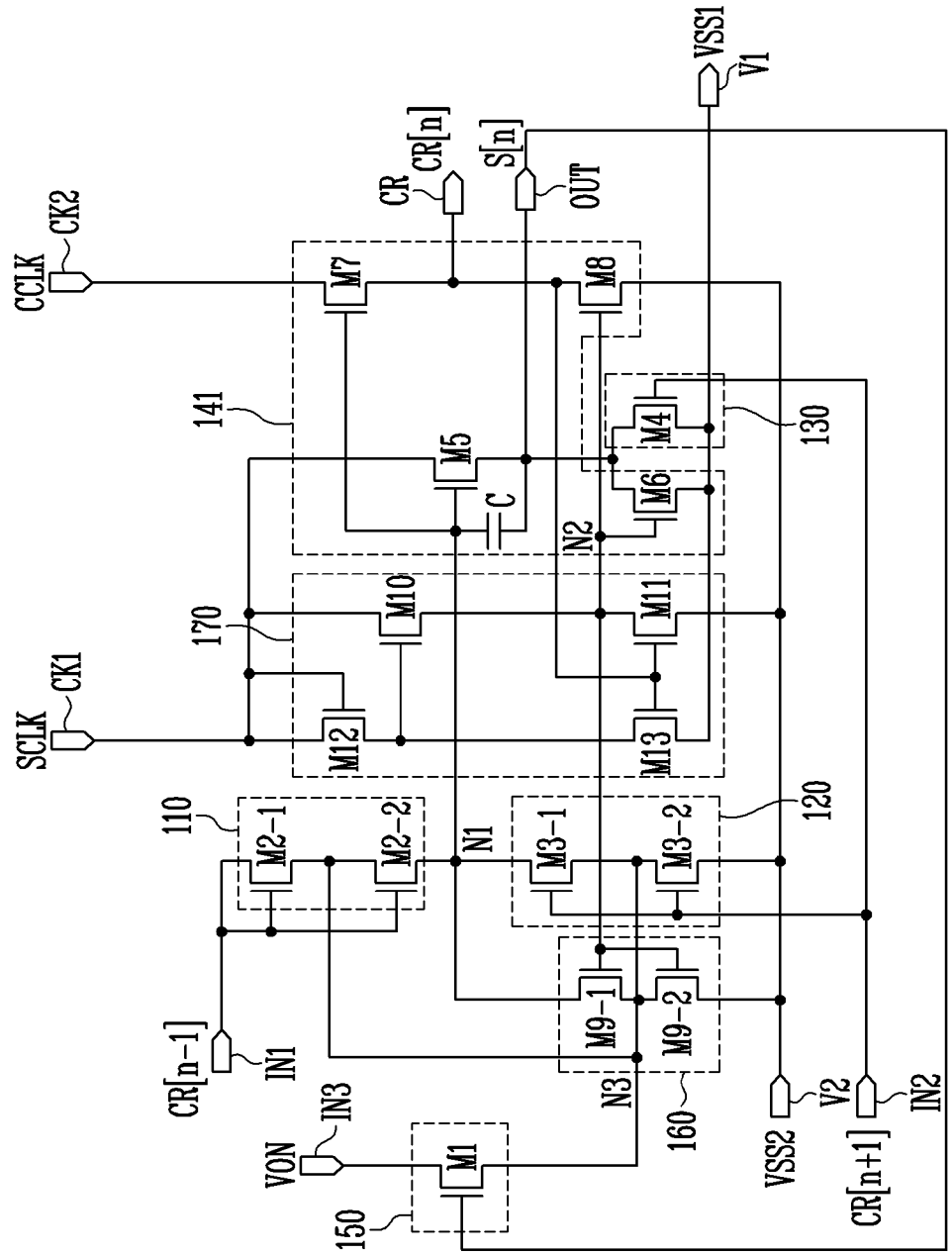
FIG. 8 is a circuit diagram illustrating another example of the stage included in the scan driver of FIG. 3.
Figure 9:
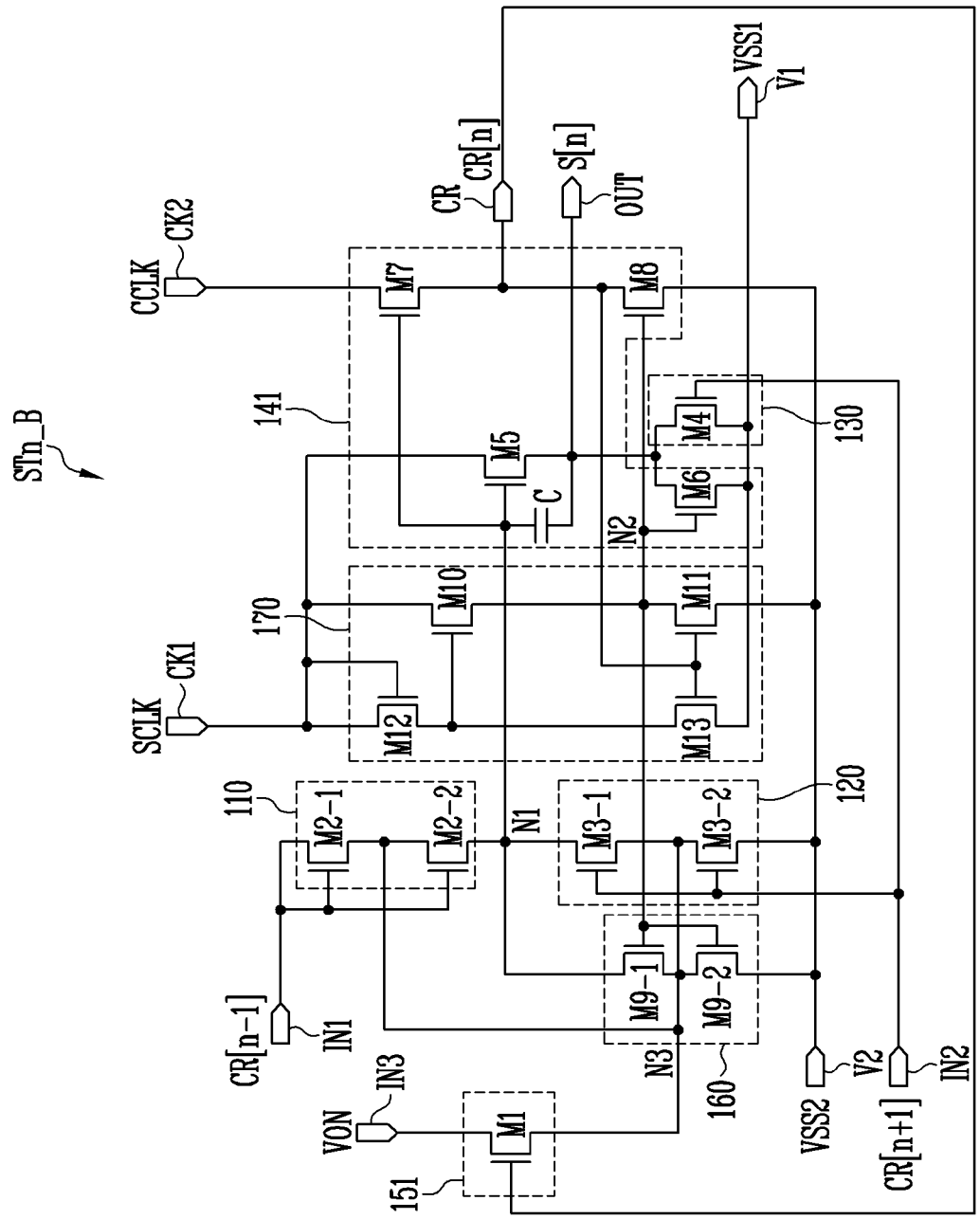
FIG. 9 is a circuit diagram illustrating still another example of the stage included in the scan driver of FIG. 3.
Figure 10:
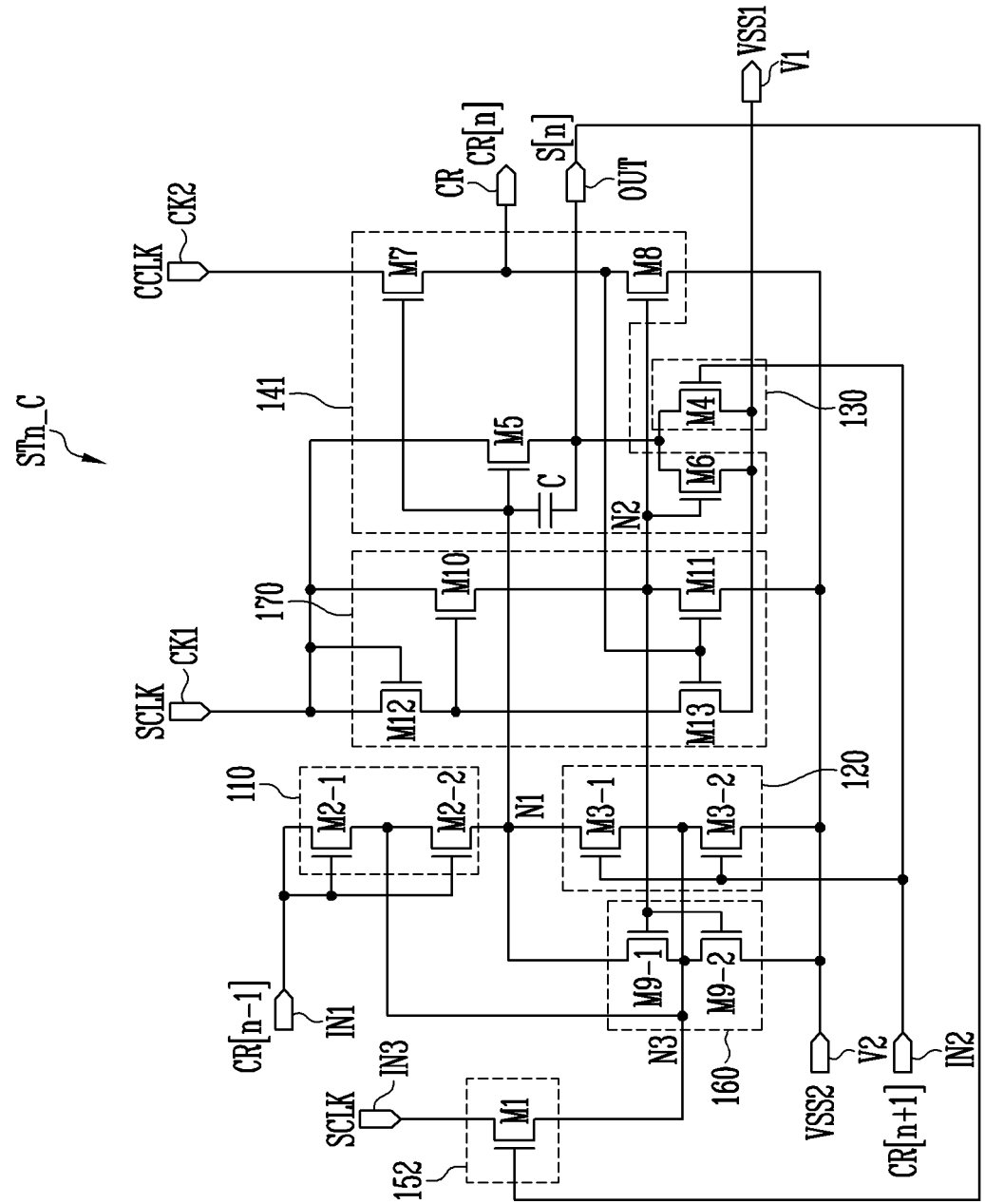
FIG. 10 is a circuit diagram illustrating still another example of the stage included in the scan driver of FIG. 3.

FIG. 8 is a circuit diagram illustrating another example of the stage included in the scan driver of FIG. 3. FIG. 9 is a circuit diagram illustrating still another example of the stage included in the scan driver of FIG. 3. FIG. 10 is a circuit diagram illustrating still another example of the stage included in the scan driver of FIG. 3.

In FIGS. 8 to 10, components identical to those described with reference to FIG. 5 are designated by like reference numerals, and their overlapping descriptions will be omitted. In addition, the stages of FIGS. 8 to 10 may have a configuration substantially identical or similar to that of the stage STn of FIG. 5, except an output circuit 141 and/or leakage control circuits 151 and 152.

Referring to FIGS. 8 to 10, an nth stage STn_A, STn_B or STn_C may include a first input circuit 110, a second input circuit 120, a first control circuit 130, an output circuit 141, a leakage control circuit 150, 151 or 152, a second control circuit 160, and a third control circuit 170.

In an embodiment, transistors included in the nth stage STn may be oxide semiconductor transistors. That is, a semiconductor layer (active pattern) of the transistors may be formed of an oxide semiconductor.

In an embodiment, as shown in FIGS. 8 to 10, a seventh transistor M7 of the output circuit 141 may be coupled between a carry output terminal CK2 and a carry output terminal CR. A carry clock signal CCLK may be supplied to the carry clock output terminal CK2. The seventh transistor M7 may supply a waveform of the carry clock signal CCLK as an nth carry signal CR[n] to the carry output terminal CR.

The carry clock signal CCLK may have a period and a width, which are different from those of the scan clock signal CCLK. Therefore, an nth scan signal S[n] and the nth carry signal CR[n] may be output with different waveforms. The stages STn_A, STn_B, and STn_C of FIGS. 8 to 10 may be applied to a display device including an external compensation pixel. For example, the display device including the external compensation pixel sequentially supplies a scan signal to pixel rows during a display period. On the other hand, the display device including the external compensation pixel may perform degradation sensing of only one pixel row during a blank period. During the blank period, the nth scan signal S[n] and the nth carry signal CR[n] may be output with different waveforms.

In an embodiment, as shown in FIG. 9, a first transistor M1 of the leakage control circuit 151 included in the stage STn_B may be coupled between a third input terminal IN3 and a third node N3. A gate electrode of the first transistor M1 may be electrically coupled to the carry input terminal CR to receive the nth carry signal CR[n]. That is, the first transistor M1 may supply a control voltage VON to the third node N3 in response to the nth carry signal CR[n].

The carry output terminal CR of the nth stage STn_B and a first input terminal of an (n+1)th stage are electrically coupled through a connecting part such as a contact hole so as to supply the nth carry signal CR[n] to the (n+1)th stage. In the embodiment of FIG. 9, the carry output terminal CR and the gate electrode of the first transistor M1 may be electrically coupled using the connecting part. Thus, it is unnecessary to form an additional contact hole for coupling the nth scan line and the gate electrode of the first transistor M1. Further, process yield can be increased, and manufacturing cost can be reduced.

As shown in FIG. 10, a signal equal to the scan clock signal SCLK may be supplied to the third input terminal IN3 of the stage STn_C. For example, the third input terminal IN3 may correspond to a scan clock terminal CK1. The scan clock signal SCLK may have a gate-on voltage in synchronization with the nth scan signal S[n].

The first transistor M1 may supply the gate-on voltage (or logic high level) of the scan clock signal SCLK to the third node N3 in response to the nth scan signal S[n]. As compared with the embodiment of FIG. 5, in the embodiment of FIG. 10, the configuration of an additional power provider for generating the control voltage VON may be removed. Thus, manufacturing cost can be reduced.

Figure 11:
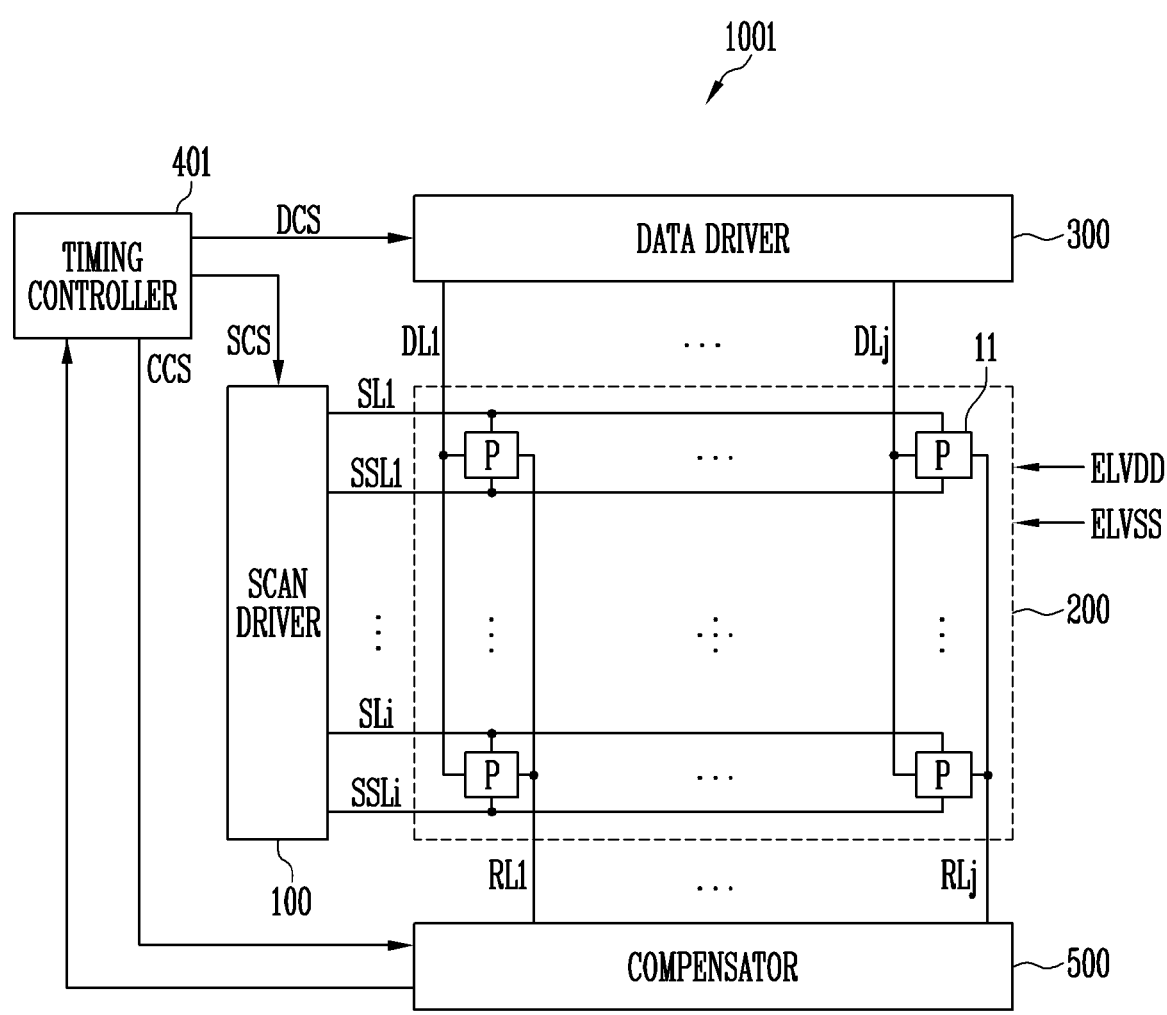
FIG. 11 is a block diagram illustrating a display device according to an embodiment.

FIG. 11 is a block diagram illustrating a display device according to an embodiment of the present disclosure.

In FIG. 11, components identical to those described with reference to FIG. 1 are designated by like reference numerals, and their overlapping descriptions will be omitted. In addition, the display device 1001 of FIG. 11 may have a configuration substantially identical or similar to the display device 1000 of FIG. 1, except the configuration of an external compensation pixel 11 and a compensator 500.

Referring to FIG. 1 and FIG. 11, the display device 1001 may include a scan driver 100, a pixel unit 200, a data driver 300, and a timing controller 401.

The timing controller 401 may generate a data driving control signal DCS, a scan driving control signal SCS, and a compensation driving control signal CCS, corresponding to synchronization signals supplied from the outside. The data driving control signal DCS generated by the timing controller 401 may be supplied to the data driver 300, the scan driving control signal SCS generated by the timing controller 401 may be supplied to the scan driver 100, and the compensation driving control signal CCS may be supplied to the compensator 500.

The compensation driving control signal CCS may control driving of the compensator 500 for pixel sensing and degradation compensation.

The scan driver 100 may receive the scan driving control signal SCS from the timing controller 401. The scan driver 100 supplied with the scan driving control signal SCS may supply a scan signal to scan lines SL1 to SLi (i is a natural number), and supply a sensing signal to sensing lines SSL1 to SSLi.

The pixel unit 200 may include pixels 11 coupled to the scan lines SL1 to SLi, the sensing lines SSL1 to SSLi, data lines DL1 to DLj, and read-out lines RL1 to RLj. The pixel unit 200 may be supplied with a first driving power source ELVDD and a second driving power source ELVSS from the outside.

The data driver 300 may be supplied with the data driving control signal DCS from the timing controller 401. The data driver 300 may supply a data voltage for pixel characteristic detection to the pixel unit 200 in a sensing period. The data driver 300 may supply a data voltage for image display to the pixel unit 200 in a display period.

The compensator 500 may generate a compensation value for compensating for degradation of the pixels 11, based on sensing values provided from the read-out lines RL1 to RLj. For example, the compensator 500 may detect and compensate for a threshold voltage change of a driving transistor included in each pixel, a mobility change of the driving transistor, and a characteristic change of an organic light emitting diode included in the pixel, etc.

In an embodiment, during the sensing period, the compensator 500 may be provided with a current or voltage extracted from the pixel 11 through the read-out lines RL1 to RLj. The extracted current or voltage may correspond to a sensing value, and the compensator 500 may detect a characteristic change of a first transistor T1 and/or an organic light emitting diode OLED, based on a variation of the sensing value, etc. The compensator 500 may calculate a compensation value for compensating for image data or a data signal DATA corresponding thereto. The compensation value may be provided to the timing controller 401 or the data driver 300.

During the display period, the compensator 500 may supply a predetermined reference voltage for image display to the pixel unit 200 through the read-out lines RL1 to RLj.

Figure 12:
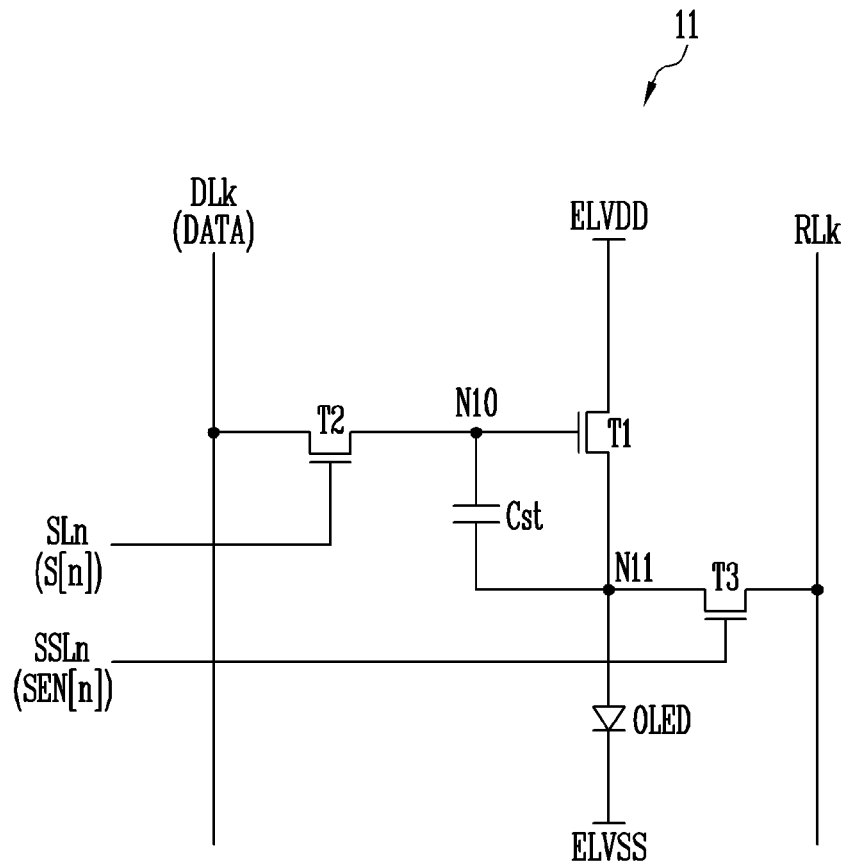
FIG. 12 is a circuit diagram illustrating an example of a pixel included in the display device of FIG. 11.

FIG. 12 is a circuit diagram illustrating an example of the pixel included in the display device of FIG. 11.

In FIG. 12, components identical to those described with reference to FIG. 2 are designated by like reference numerals, and their overlapping descriptions will be omitted. In addition, the pixel 11 of FIG. 12 may have a configuration substantially identical or similar to that of the pixel 10 of FIG. 2.

Referring to FIG. 12, the pixel 11 may include an organic light emitting diode OLED, a first transistor (driving transistor) T1, a second transistor T2, a third transistor T3, and a storage capacitor Cst.

The first transistor T1 may generate a sensing current corresponding to a voltage charged in the storage capacitor Cst or a driving current for emission of the organic light emitting diode OLED.

The third transistor T3 may be coupled between a read-out line RLk and a first electrode (i.e., an eleventh node N11) of the first transistor T1. The third transistor T3 may transfer a sensing current to the read-out line RLk in response to a sensing signal SEN[n]. The sensing current may be provided to the compensator 500. For example, the sensing current may be used to calculate a variation of mobility and threshold voltage of the first transistor T1. Mobility and threshold voltage information may be calculated based on the relationship between a sensing current and a voltage for sensing. In an embodiment, the sensing current may be converted into a voltage form to be used in a compensation operation.

Figure 13:
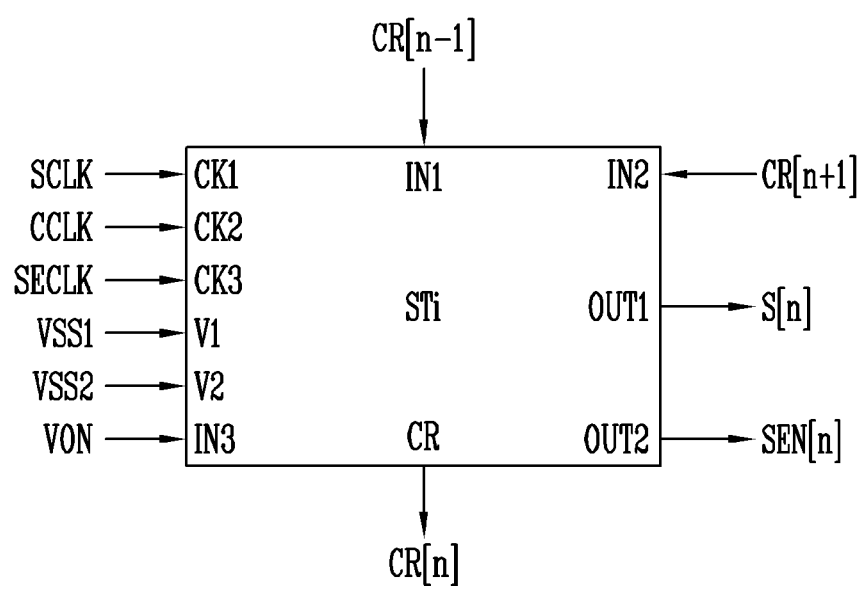
FIG. 13 is a diagram illustrating an example of terminals coupled to a stage of a scan driver included in the display device of FIG. 11.

FIG. 13 is a diagram illustrating an example of terminals coupled to a stage of the scan driver included in the display device of FIG. 11.

In FIG. 13, components identical to those described with reference to FIG. 3 are designated by like reference numerals, and their overlapping descriptions will be omitted. In addition, the terminals of FIG. 13 may have a configuration substantially identical or similar to that of the terminals of the stage of FIG. 3, except clock terminals and output terminals.

Referring to FIG. 3 and FIG. 13, each nth stage STi may include a first input terminal IN1, a second input terminal IN2, a third input terminal IN3, a scan clock input terminal CK1, a carry clock input terminal CK2, a sensing clock input terminal CK3, a first power input terminal V1, a second power input terminal V2, a carry output terminal CR, a first output terminal OUT1, and a second output terminal OUT2.

The first input terminal IN1 may receive a carry signal CR[n−1] of a previous stage. The second input terminal IN2 may receive a carry signal CR[n+1] of a next stage. The third input terminal IN3 may receive a control voltage VON. The carry output terminal CR may output a carry signal CR[n]. The first power input terminal V1 may be supplied with a first power source VSS1, and the second power input terminal V2 may be supplied with a second power source VSS2.

The first output terminal OUT1 may output a scan signal S[n]. The scan signal S[n] may be supplied to the pixel 11 of FIG. 12 through a scan line corresponding thereto.

The second output terminal OUT2 may output a sensing signal SEN[n]. The sensing signal SEN[n] may be supplied to the pixel 11 of FIG. 12 through a sensing line corresponding thereto.

The scan clock input terminal CK1 may receive a scan clock signal SCLK corresponding to the output of the scan signal S[n].

The carry clock input terminal CK2 may receive a carry clock signal CCLK corresponding to the output of the carry signal CR[n].

The sensing clock input terminal CK3 may receive a sensing clock signal SECLK corresponding to the output of the sensing signal SEN[n].

In an embodiment, during a predetermined sensing period, a corresponding scan clock signal SCLK, a corresponding carry clock signal CCLK, and a corresponding sensing clock signal SECLK may be output at different timings, and have different widths and periods.

Figure 14:
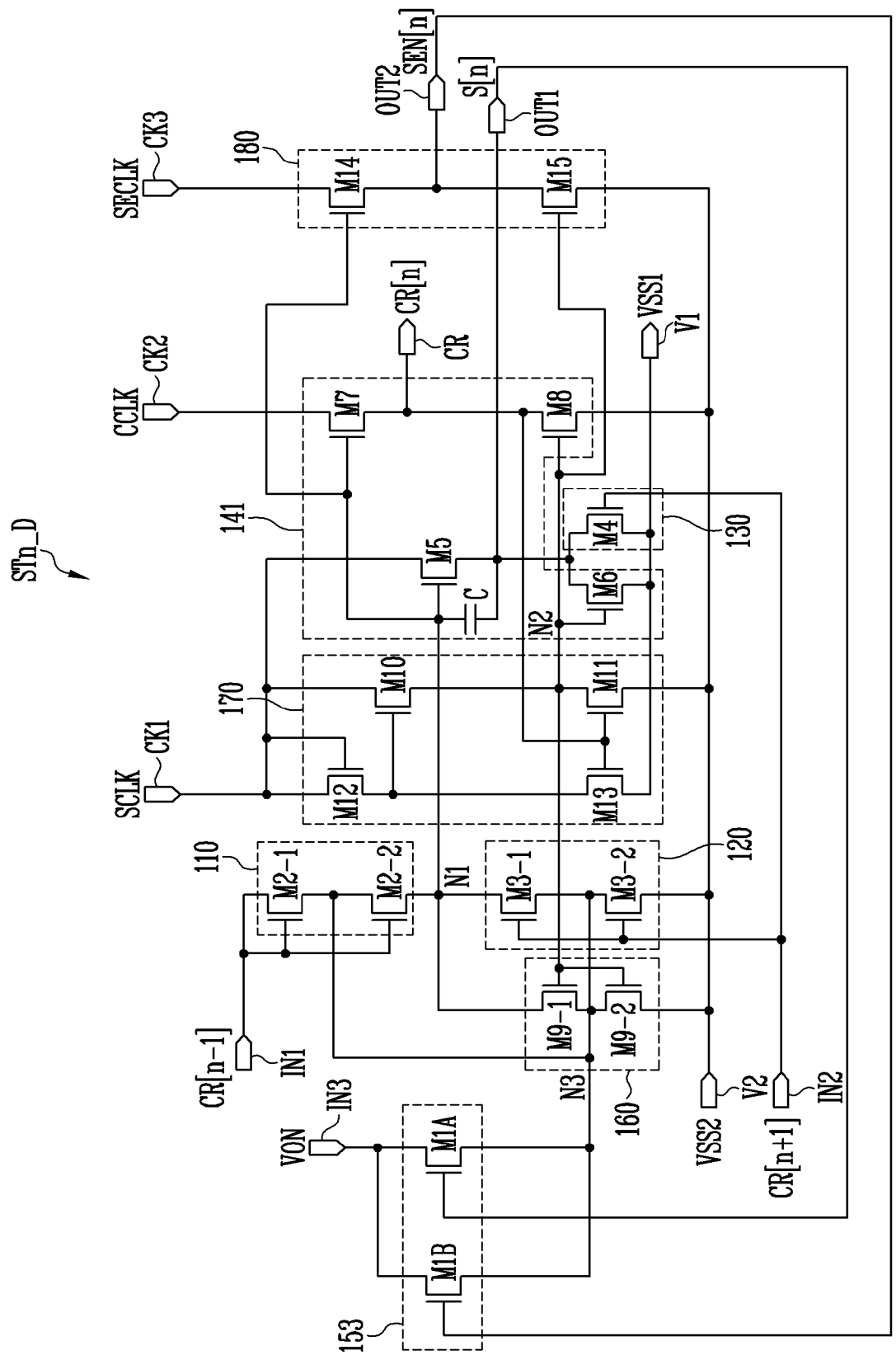
FIG. 14 is a circuit diagram illustrating an example of the stage of FIG. 13.

FIG. 14 is a circuit diagram illustrating an example of the stage of FIG. 13.

In FIG. 14, components identical to those described with reference to FIG. 5 and FIG. 8 are designated by like reference numerals, and their overlapping descriptions will be omitted. In addition, the stage STn_D of FIG. 14 may have a configuration substantially identical or similar to that of the stage STn or STn_A of FIG. 5 or FIG. 8, except the configuration of a leakage control circuit 153 and a second output circuit 180.

Referring to FIG. 5, FIG. 8, and FIG. 14, the nth stage STn_D may include a first input circuit 110, a second input circuit 120, a first control circuit 130, a first output circuit 141, a second output circuit 180, a second control circuit 160, a third control circuit 170, and a leakage control circuit 153.

The first input circuit 110 may precharge a voltage of a first node N1 in response to a carry signal CR[n−1] of a previous stage or the scan start signal STV of FIG. 3. The second input circuit 120 may discharge the voltage of the first node N1 in response to a carry signal (i.e., an (n+1)th carry signal CR[n+1] of a next stage.

The first control circuit 130 may discharge a voltage of a first output terminal OUT1 that outputs an nth scan signal S[n] in response to the (n+1)th carry signal CR[n+1].

The first output circuit 141 may be coupled to a scan clock input terminal CK1, a carry input terminal CK2, a first power input terminal V1, and a second power input terminal V2. The first output circuit 141 may output the nth scan signal S[n] corresponding to a scan clock signal SCLK to the first output terminal OUT1 and output an nth carry signal CR[n] corresponding to a carry clock signal CCLK to a carry output terminal CR, in response to the voltage of the first node N1 and a voltage of a second node N2. That is, a waveform of the nth scan signal S[n] and a waveform of the nth carry signal CR[n] may be determined independently from each other according to the scan clock signal SCLK and the carry clock signal CCLK.

The second output circuit 180 may be coupled between a sensing clock input terminal CK3 and the second power input terminal V2. The second output circuit 180 may output, to a second output terminal OUT2, an nth sensing signal SEN[n] corresponding to a sensing clock signal SECLK supplied to the sensing clock input terminal CK3, in response to the voltage of the first node N1 and the voltage of the second node N2. In an embodiment, the second output circuit 180 may include fourteenth and fifteenth transistors M14 and M15.

The fourteenth transistor M14 may be coupled between the sensing clock input terminal CK3 and the second output terminal OUT2. A gate electrode of the fourteenth transistor M14 may be coupled to the first node N1. The fourteenth transistor M14 may supply a gate-on voltage to the second output terminal OUT2 in response to the voltage of the first node N1. For example, the fourteenth transistor M14 may serve as a pull-up buffer.

The fifteenth transistor M15 may be coupled between the second output terminal OUT2 and the second power input terminal V2. The fifteenth transistor M15 may include a gate electrode coupled to the second node N2. The fifteenth transistor M15 may supply a gate-off voltage to the second output terminal OUT2 in response to the voltage of the second node N2. For example, the fifteenth transistor M15 may hold the voltage of the second output terminal OUT2 as a gate-off voltage level (or logic low level).

The second control circuit 160 may hold the voltage of the first node N1 as a predetermined gate-off voltage in response to the voltage of the second node N2. The third control circuit 170 may transfer the scan clock signal SCLK to the second node N2 in response to the scan clock signal SCLK and then supply the gate-off voltage to the second node N2 in response to the nth carry signal CR[n].

The leakage control circuit 153 may supply a control voltage VON supplied to a third input terminal IN3 to the first input circuit 110, the second input circuit 120, and the second control circuit 160 in response to the nth scan signal S[n] and the nth sensing signal SEN[n].

The leakage control circuit 153 may include a 1Ath transistor M1A and a 1Bth transistor M1B, which are coupled between the third input terminal IN3 and a third node N3. The 1Ath transistor M1A may include a gate electrode that receives the nth scan signal S[n]. The 1Bth transistor M1B may include a gate electrode that receives the nth sensing signal SEN[n].

The 1Ath transistor M1A may supply the control voltage VON to the third node N3 in response to the nth scan signal S[n]. The 1Bth transistor M1B may supply the control voltage VON to the third node N3 in response to the nth sensing signal SEN[n]. Accordingly, the control voltage VON can be supplied to the third node N3 when at least one of the nth scan signal S[n] and the nth sensing signal SEN[n] has the gate-on voltage. Thus, the voltage of the first node N1 can be maintained without current leakage during a long scan-on time (sensing-on time).

Figure 15:
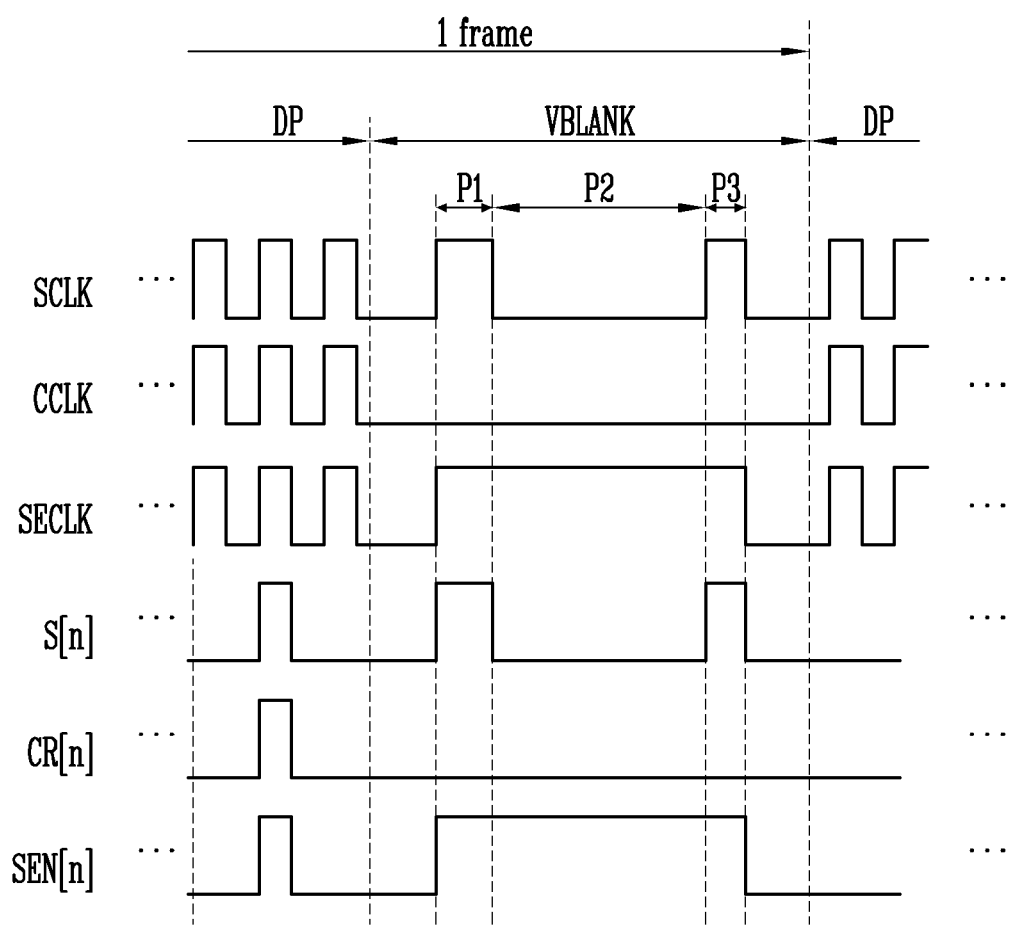
FIG. 15 is a waveform diagram illustrating an example of an operation of the stage of FIG. 13.

FIG. 15 is a waveform diagram illustrating an example of an operation of the stage of FIG. 13.

Referring to FIGS. 12 to 15, one frame for displaying an image may include a display period DP and a vertical blank period VBLANK.

The display period DP is a period in which the pixel 11 displays an image corresponding to a data signal. In an embodiment, during the display period DP, the scan clock signal SCLK, the carry clock signal CCLK, and the sensing clock signal SECLK may be output at the same timing. Accordingly, the nth scan signal S[n], the nth carry signal CR[n], and the nth sensing signal SEN[n] may simultaneously have the gate-on voltage. During the display period DP, the scan signal, the carry signal, and the sensing signal may be sequentially supplied to pixel rows.

The vertical blank period VBLANK is a sensing period in which a sensing value is extracted from the pixel 11 through the read-out line RLk. In an embodiment, mobility of the first transistor T1 may be detected during the vertical blank period VBLANK. However, this is merely illustrative, and a threshold voltage variation of the first transistor T1 and/or a characteristic change of the organic light emitting diode OLED may be detected during the sensing period.

The vertical blank period VBLANK may include first to third periods P1, P2, and P3. As shown in FIG. 15, the scan clock signal SCLK, the carry clock signal CCLK, and the sensing clock signal SECLK have different timings during the vertical blank period VBLANK. The scan clock signal SCLK may have the gate-on voltage in the first period P1 and the third period P3, and the sensing clock signal SECLK may maintain the gate-on voltage during the first to third periods P1, P2, and P3.

In an embodiment, a sensing operation in the vertical blank period VBLANK is performed on only one pixel row, and hence the carry signal is not output. Thus, the carry clock signal CCLK and the nth carry signal CR[n] can maintain the gate-off voltage.

The first period P1 may be a data signal input period for sensing. During the first period P1, the nth scan signal S[n] and the nth sensing signal SEN[n] may have the gate-on voltage.

The second period P2 may be a current sensing period. That is, a current sensed by the nth sensing signal SEN[n] having the gate-on voltage may be transferred to the compensator 500 of FIG. 11 through the read-out line RLk.

The third period P3 may be a data rewrite period. The nth scan signal S[n] may again have the gate-on voltage. The nth sensing signal SEN[n] may maintain the gate-on voltage. Therefore, the pixel 11 may again emit light with a luminance with which light is emitted in the display period DP of a current frame.

As described above, in the vertical blank period VBLANK, the nth stage STn_D is to maintain the output of the nth sensing signal SEN[n] for a long time of 200 μs or more. Therefore, a voltage charged in the first node N1 and a boosted voltage are to be maintained for a long time.

In the nth state STn_D according to the embodiment of the present disclosure, the control voltage VON having a high potential is supplied to the third node N3 in response to the nth scan signal S[n] and the nth sensing signal SEN[n], so that current leakage from the first node N1 to the transistors coupled thereto can be minimized. Further, a scan driver strong against a threshold voltage change due to degradation of the transistors included in the stage can be implemented. Thus, the stable output of a scan signal and a sensing signal can be ensured even when the display device is used for a long time, and the reliability of the display device can be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A scan driver comprising:
a plurality of stages each configured to output a scan signal,
wherein an nth stage, where n is a natural number, comprises:
a first input circuit configured to control a voltage of a first node in response to a carry signal of a previous stage, which is supplied to a first input terminal;
a second input circuit configured to control the voltage of the first node in response to a carry signal of a next stage, which is supplied to a second input terminal;
a first control circuit configured to control a voltage of a first output terminal that outputs an nth scan signal in response to the carry signal of the next stage;
a first output circuit coupled to a scan clock input terminal, a carry clock input terminal, a first power input terminal to which a first power source is supplied, and a second power input terminal to which a second power source is supplied, the first output circuit configured to output the nth scan signal corresponding to a scan clock signal supplied to the scan clock input terminal and an nth carry signal corresponding to a carry clock signal supplied to the carry clock input terminal respectively to the first output terminal and a carry output terminal in response to the voltage of the first node and a voltage of a second node;
a second output circuit coupled to a sensing clock input terminal and the second power input terminal, the second output circuit outputting an nth sensing signal corresponding to a sensing clock signal supplied to the sensing clock input terminal in response to the voltage of the first node and the voltage of the second node;
a leakage control circuit configured to supply a control voltage supplied to a third input terminal to the first input circuit and the second input circuit in response to the nth scan signal and the nth sensing signal, and
wherein the leakage control circuit comprises:
a 1Ath transistor coupled between the third input terminal and a third node, the 1Ath transistor having a gate electrode configured to receive the nth scan signal; and
a 1Bth transistor coupled between the third input terminal and the third node, the 1Bth transistor having a gate electrode configured to receive the nth sensing signal.

2. The scan driver of claim 1, wherein the first and second input circuits, the first control circuit, the first and second output circuits, and the leakage control circuit are configured with oxide semiconductor transistors.

3. The scan driver of claim 1, wherein the control voltage is a static voltage that is equal to or larger than a gate-on voltage of the scan clock signal and is smaller than a voltage boosted at the first node.

4. The scan driver of claim 1, wherein the first input circuit comprises a plurality of second transistors coupled in series between the first input terminal and the first node, the plurality of second transistors having gate electrodes commonly coupled to the first input terminal, and
wherein a common node of the second transistors is electrically coupled to the third node.

5. The scan driver of claim 1, wherein the second input circuit comprises a plurality of third transistors coupled in series between the first node and the second input terminal, the plurality of third transistors having gate electrodes commonly coupled to the second input terminal, and
wherein a common node of the third transistors is electrically coupled to the third node.

6. The scan driver of claim 1, further comprising:
a second control circuit configured to hold the voltage of the first node as a gate-off voltage in response to the voltage of the second node; and
a third control circuit configured to control the voltage of the second node in response to the scan clock signal and the nth carry signal.

7. The scan driver of claim 6, wherein each of the first input circuit, the second input circuit, and the second control circuit comprises a plurality of transistors coupled in series,
wherein the third node corresponds to common nodes of the respective transistors coupled in series, and
wherein at least one of the 1Ath transistor and the 1Bth transistor is configured to supply the control voltage to the third node.

8. A scan driver comprising:
a plurality of stages each configured to output a scan signal,
wherein an nth stage, where n is a natural number, comprises:
a first input circuit configured to control a voltage of a first node in response to a carry signal of a previous stage, which is supplied to a first input terminal;
a second input circuit configured to control the voltage of the first node in response to a carry signal of a next stage, which is supplied to a second input terminal;
a first control circuit configured to control a voltage of an output terminal that outputs an nth scan signal in response to the carry signal of the next stage;
an output circuit coupled to a clock input terminal, a first power input terminal to which a first power source is supplied, and a second power input terminal to which a second power source is supplied, the output circuit configured to output the nth scan signal and an nth carry signal respectively to the output terminal and a carry output terminal in response to the voltage of the first node and a voltage of a second node; and
a leakage control circuit configured to supply a control voltage supplied to a third input terminal to the first input circuit and the second input circuit in response to one of the nth scan signal and the nth carry signal, and
wherein the leakage control circuit comprises a first transistor coupled between the third input terminal and a third node, the first transistor having a gate electrode that receives the nth scan signal or the nth carry signal,
wherein the control voltage is equal to or larger than a gate-on voltage of a scan clock signal supplied to the clock input terminal and is smaller than a voltage boosted at the first node.

9. The scan driver of claim 8,
wherein the control voltage is equal to the scan clock signal supplied to the clock input terminal.

10. The scan driver of claim 8, wherein the first input circuit comprises:
a plurality of second transistors coupled in series between the first input terminal and the first node, the plurality of second transistors having gate electrodes commonly coupled to the first input terminal.

11. The scan driver of claim 8, wherein the second input circuit comprises:
a plurality of third transistors coupled in series between the first node and the second power input terminal, the plurality of third transistors having gate electrodes commonly coupled to the second input terminal.

12. A scan driver of claim 8, comprising:
a plurality of stages each configured to output a scan signal,
wherein an nth stage, where n is a natural number, comprises:
a first input circuit configured to control a voltage of a first node in response to a carry signal of a previous stage, which is supplied to a first input terminal;
a second input circuit configured to control the voltage of the first node in response to a carry signal of a next stage, which is supplied to a second input terminal;
a first control circuit configured to control a voltage of an output terminal that outputs an nth scan signal in response to the carry signal of the next stage;
an output circuit coupled to a clock input terminal, a first power input terminal to which a first power source is supplied, and a second power input terminal to which a second power source is supplied, the output circuit configured to output the nth scan signal and an nth carry signal respectively to the output terminal and a carry output terminal in response to the voltage of the first node and a voltage of a second node; and
a leakage control circuit configured to supply a control voltage supplied to a third input terminal to the first input circuit and the second input circuit in response to one of the nth scan signal and the nth carry signal, and
wherein the leakage control circuit comprises a first transistor coupled between the third input terminal and a third node, the first transistor having a gate electrode that receives the nth scan signal or the nth carry signal,
wherein the output circuit comprises:
  a fifth transistor coupled between the clock input terminal and a first output terminal that outputs the nth scan signal, the fifth transistor having a gate electrode coupled to the first node; and
  a sixth transistor coupled between the first output terminal and the first power input terminal, the sixth transistor having a gate electrode coupled to a second node.

13. The scan driver of claim 12, wherein the output circuit further comprises:
a seventh transistor coupled between the clock input terminal and the carry output terminal, the seventh transistor having a gate electrode coupled to the first node;
an eighth transistor coupled between the carry output terminal and the second power input terminal, the eighth transistor having a gate electrode coupled to the second node; and
a capacitor coupled between the first node and the first output terminal.

14. The scan driver of claim 8, wherein the first control circuit comprises:
a fourth transistor coupled between the first output terminal and the first power input terminal, the fourth transistor having a gate electrode coupled to the second input terminal,
wherein the fourth transistor discharges a voltage of the first output terminal as the voltage of the first power source.

15. The scan driver of claim 8, further comprising:
a second control circuit configured to hold the voltage of the first node as a gate-off voltage in response to the voltage of the second node; and
a third control circuit configured to control the voltage of the second node in response to the scan clock signal and the nth carry signal.

16. The scan driver of claim 15, wherein the second control circuit comprises:
a plurality of ninth transistors coupled in series between the first node and the second power input terminal, the plurality of ninth transistors having gate electrodes commonly coupled to the second node,
wherein a common node of the ninth transistors is electrically coupled to the third node,
wherein the first power source and the second power source are set to a gate-off voltage, and
wherein a voltage level of the second power source is smaller than that of the first power source.

17. The scan driver of claim 15, wherein the third control circuit comprises:
a tenth transistor coupled between the clock input terminal and the second node;
an eleventh transistor coupled between the second node and the second power input terminal; and
a twelfth transistor and a thirteenth transistor coupled in series between the clock input terminal and the first power input terminal,
wherein a gate electrode of the tenth transistor is coupled to a common node of the twelfth and thirteenth transistors,
a gate electrode of the twelfth transistor is coupled to the clock input terminal, and
gate electrodes of the eleventh transistor and the thirteenth transistor are commonly coupled to the carry output terminal.

* * * * *